US012165902B2

(12) United States Patent
Mitsuishi et al.

(10) Patent No.: US 12,165,902 B2
(45) Date of Patent: Dec. 10, 2024

(54) SUBSTRATE BONDING APPARATUS AND SUBSTRATE BONDING METHOD

(71) Applicant: NIKON CORPORATION, Tokyo (JP)

(72) Inventors: Hajime Mitsuishi, Yokohama (JP); Isao Sugaya, Kawasaki (JP); Atsushi Kamashita, Komae (JP); Masashi Okada, Sagamihara (JP); Minoru Fukuda, Tokyo (JP); Hidehiro Maeda, Yokohama (JP)

(73) Assignee: Nikon Corporation, Tokyo (JP)

( * ) Notice: Subject to any disclaimer, the term of this patent is extended or adjusted under 35 U.S.C. 154(b) by 503 days.

(21) Appl. No.: 17/453,734

(22) Filed: Nov. 5, 2021

(65) Prior Publication Data
US 2022/0084870 A1 Mar. 17, 2022

Related U.S. Application Data

(63) Continuation of application No. PCT/JP2020/018522, filed on May 7, 2020.

(30) Foreign Application Priority Data

May 8, 2019 (JP) .................................. 2019-088055

(51) Int. Cl.
*H01L 21/683* (2006.01)
*H01L 21/67* (2006.01)
*H01L 21/687* (2006.01)

(52) U.S. Cl.
CPC .... *H01L 21/6838* (2013.01); *H01L 21/67092* (2013.01); *H01L 21/67259* (2013.01);
(Continued)

(58) Field of Classification Search
None
See application file for complete search history.

(56) References Cited

U.S. PATENT DOCUMENTS 6,451,670 B1 9/2002 Takisawa et al.
8,758,552 B2 * 6/2014 Canale .................. B32B 43/006
156/707

(Continued)

FOREIGN PATENT DOCUMENTS

CN 1209644 A 3/1999
CN 1591816 A 3/2005
(Continued)

OTHER PUBLICATIONS

Office Action issued by the Japanese Office on Aug. 30, 2022 in counterpart Japanese Patent Application No. 2021-518393, and English Translation thereof.
(Continued)

*Primary Examiner* — Jethro M. Pence
(74) *Attorney, Agent, or Firm* — Finnegan, Henderson, Farabow, Garrett & Dunner, L.L.P.

(57) ABSTRACT

A substrate holder includes a central support portion configured to support a central portion of a substrate, and an circumferential support portion arranged on an outside of the central support portion and configured to support a circumferential portion on an outside of the central portion, and the circumferential support portion is configured to support the circumferential portion so that at least a partial region of the circumferential portion is curved toward the substrate holder with a curvature greater than that of the central portion.

16 Claims, 22 Drawing Sheets

(52) U.S. Cl.
CPC .. *H01L 21/68742* (2013.01); *H01L 21/68785* (2013.01); *H01L 21/68735* (2013.01)

(56) References Cited

U.S. PATENT DOCUMENTS

| | | | |
|---|---|---|---|
| 9,296,194 B2* | 3/2016 | Canale | H01L 21/67253 |
| 9,312,161 B2 | 4/2016 | Wimplinger et al. | |
| 9,533,484 B2* | 1/2017 | Canale | H01L 21/6835 |
| 9,576,838 B2* | 2/2017 | Woodard | H01L 21/6835 |
| 9,865,491 B2* | 1/2018 | Woodard | B32B 43/006 |
| 10,438,918 B2 | 10/2019 | Omori et al. | |
| 10,825,707 B2 | 11/2020 | Mitsuishi et al. | |
| 2002/0034859 A1 | 3/2002 | Takisawa et al. | |
| 2008/0068580 A1 | 3/2008 | Mori et al. | |
| 2008/0169056 A1 | 7/2008 | Yamamoto et al. | |
| 2015/0210057 A1 | 7/2015 | Wagenleithner et al. | |
| 2017/0017893 A1 | 1/2017 | Smith et al. | |
| 2018/0047699 A1 | 2/2018 | Omori et al. | |
| 2018/0090348 A1 | 3/2018 | Huang et al. | |
| 2019/0122915 A1 | 4/2019 | Mitsuishi et al. | |
| 2022/0084870 A1 | 3/2022 | Mitsuishi et al. | |

FOREIGN PATENT DOCUMENTS

| | | |
|---|---|---|
| CN | 101226876 A | 7/2008 |
| CN | 105374709 A | 3/2016 |
| CN | 105374725 A | 3/2016 |
| CN | 107086275 B | 8/2017 |
| CN | 107706129 A | 2/2018 |
| JP | 4-94735 U1 | 8/1992 |
| JP | H0766093 A | 3/1995 |
| JP | H11-74164 A | 3/1999 |
| JP | 2005-85881 A | 3/2005 |
| JP | 2007-214227 A | 8/2007 |
| JP | 2008-103703 A | 5/2008 |
| JP | 2008-172159 A | 7/2008 |
| JP | 2009-032915 A | 2/2009 |
| JP | 2009-064827 A | 3/2009 |
| JP | 2012-222284 A | 11/2012 |
| JP | 2015-095649 A | 5/2015 |
| JP | 2016-001762 A | 1/2016 |
| JP | 2016-039254 | 3/2016 |
| JP | 2018-026414 A | 2/2018 |
| JP | 2018-026573 A | 2/2018 |
| KR | 10-2008-0067294 A | 8/2008 |
| KR | 10-2013-0139737 | 12/2013 |
| KR | 10-2015-0088691 | 8/2015 |
| KR | 10-2018-0018341 A | 2/2018 |
| KR | 10-2019-0018627 A | 2/2019 |
| TW | 200845286 A | 11/2008 |
| TW | 201801225 A | 1/2018 |
| TW | 201818449 A | 5/2018 |
| WO | WO 2014/191033 A1 | 12/2014 |
| WO | WO 2017/217431 A1 | 12/2017 |

OTHER PUBLICATIONS

The Second Office Action issued by the China National Intellectual Property Administration in counterpart Chinese Patent Application No. 202080033276.3, dated Nov. 30, 2023, and English Translation thereof.
International Search Report of International Application No. PCT/JP2020/018522 dated Aug. 4, 2020.
Office Action issued by the Taiwan Intellectual Property Office on May 12, 2022 in counterpart Taiwanese Patent Application No. 109114450, and English Translation thereof.
Office Action issued by the Taiwan Intellectual Property Office on Feb. 15, 2023 in counterpart Taiwanese Patent Application No. 109114450, and English Translation thereof.
Computer-generated English translation of TW 201801225 A.
Computer-generated English translation of CN 107086275 B.
Computer-generated English translation of JP 2009064827 A.
Notice of Preliminary Rejection issued by Korean Intellectual Property Office in counterpart Korean Patent Application No. 10-2021-7036322, having mailing date of Jul. 27, 2023.
International Preliminary Report on Patentability, in corresponding international application No. PCT/JP2020/018522, issued Nov. 2, 2021.
Office Action and Search Report issued by the China Intellectual Property Administration on May 29, 2023 in counterpart Chinese Patent Application No. 202080033276.3, and English Translation thereof.

* cited by examiner

ENLARGING OF CONTACT REGION AND
RELATIVE SHAPE OF UPPER AND LOWER WAFER

ENLARGING OF CONTACT REGION AND
RELATIVE SHAPE OF UPPER AND LOWER WAFER

SUBSTRATE BONDING APPARATUS AND SUBSTRATE BONDING METHOD

The contents of the following Japanese patent application(s) are incorporated herein by reference:
NO. 2019-088055 filed in JP on May 8, 2019
NO. PCT/JP2020/018522 filed in WO on May 7, 2020

BACKGROUND

1. Technical Field

The present invention relates to a substrate bonding apparatus and a substrate bonding method.

2. Related Art

Known is a technology of retaining substrates whose surfaces have been activated on substrate holders and directly bonding the surfaces of the substrates to form a stacked substrate.

As one example of the substrate holder, there is a substrate holder configured to retain, by vacuum adsorption, a substrate that is placed on a retaining surface formed by a wall portion continuing in an annular form on an outer peripheral side and multiple support pins arranged on an inside of the wall portion (for example, Patent Document 1).
Patent Document 1: Japanese Patent Application Publication No. 2015-95649

However, in the bonding using the substrate holder, there is a malfunction that numerous voids occur in a circumferential portion of the stacked substrate.

DESCRIPTION OF EXEMPLARY EMBODIMENTS

Hereinafter, embodiments of the present invention will be described. The embodiments do not limit the invention according to the claims, and all the combinations of the features described in the embodiments are not necessarily essential to solutions provided by aspects of the invention.

Figure 1:
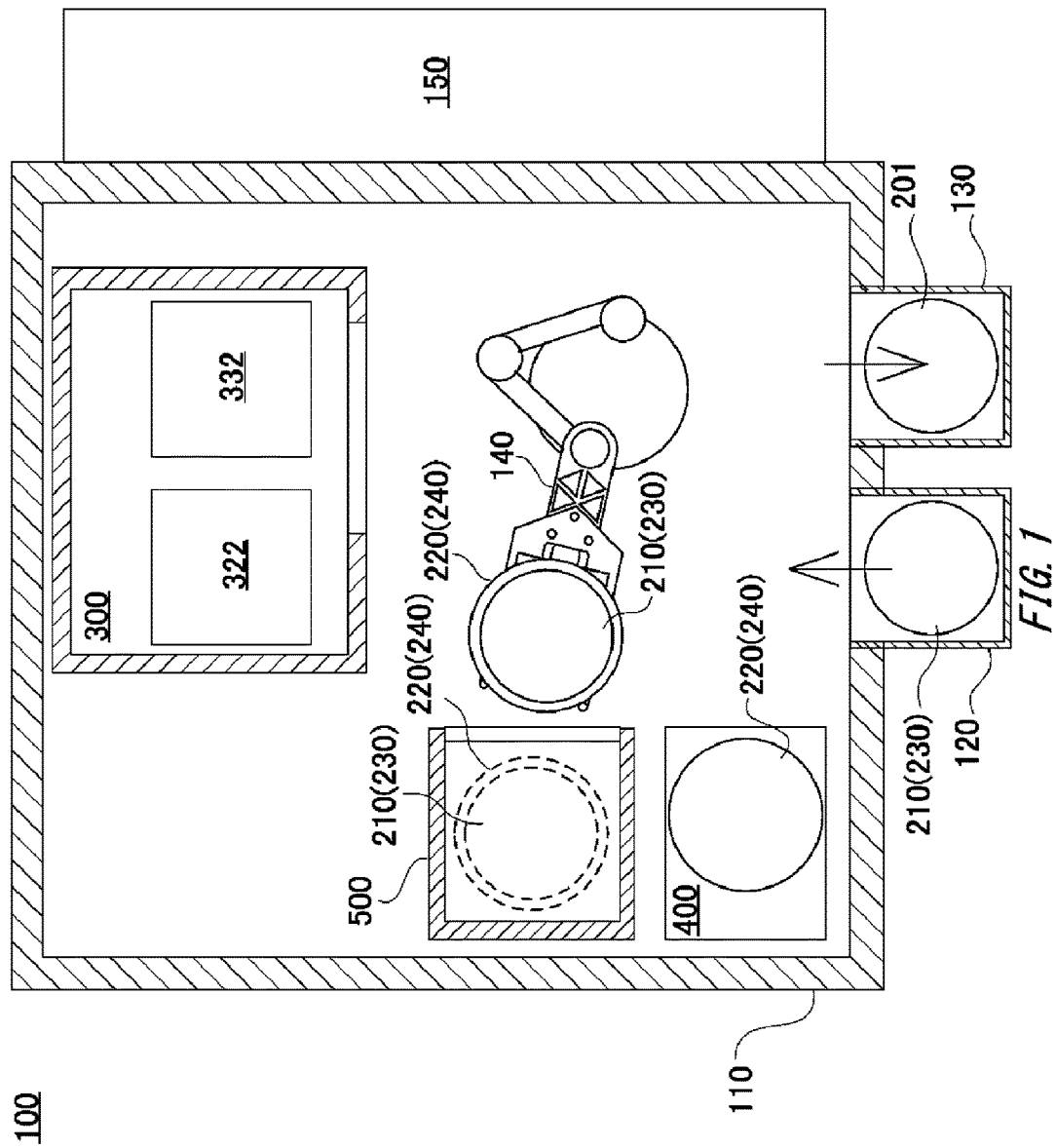
FIG. 1 is a schematic plan view of a substrate bonding apparatus 100.

FIG. 1 is a schematic plan view of a substrate bonding apparatus 100.

The substrate bonding apparatus 100 comprises a housing 110, substrate cassettes 120 and 130, a holder stocker 400, a conveying unit 140, a bonding unit 300, a prealigner 500, and a control unit 150.

The housing 110 is configured to accommodate the substrate cassettes 120 and 130, the conveying unit 140, the bonding unit 300, the holder stocker 400, and the prealigner 500.

An inside of the housing 110 is temperature-controlled, and is, for example, kept at a room temperature.

The substrate cassette 120 is configured to accommodate substrates 210 and 230 to be bonded.

The substrate cassette 130 is configured to accommodate a stacked substrate 201 fabricated by bonding at least two substrates 210 and 230.

The substrates 210 and 230 each have a plurality of structures formed on a surface of a silicon wafer.

One example of the plurality of structures is a plurality of circuit regions arranged periodically in a plane direction on a surface of each of the substrates 210 and 230, and each of the plurality of circuit regions is provided with a wiring, a protective film, and a connection structure such as a pad and a bump serving as a connection terminal when the substrates 210 and 230 are electrically connected to other substrates 230 and 210, a lead frame and the like, which are formed by a photolithography technology or the like. Another example of the plurality of structures is a plurality of alignment marks serving as indicators when aligning the substrates 210 and 230 with the other substrates 230 and 210.

The plurality of alignment marks is provided on scribe lines arranged between the plurality of circuit regions on the surface of each of the substrates 210 and 230, for example.

The holder stocker 400 is configured to accommodate substrate holders 220 and 240 configured to retain the substrates 210 and 230.

The substrate holders 220 and 240 are formed of a rigid material such as alumina ceramics, and are configured to adsorb and retain the substrates 210 and 230, the stacked substrate 201 and the like by an electrostatic chuck, a vacuum chuck or the like.

The substrate holders 220 and 240 may have a flat shape, a centrally convex shape, or, for example, a free curved surface such as a shape corresponding to distortion in a plane of the substrate to be retained, as an entire shape of a support surface.

The conveying unit 140 is configured to retain and convey, as a single body, each of the substrates 210 and 230, the substrate holders 220 and 240, the stacked substrate 201 and the like, or to retain and convey the substrate holders 220 and 240 and the like retaining the substrates 210 and 230, the stacked substrate 201 and the like.

The bonding unit 300 has an upper stage 322 and a lower stage 332 configured to face each other.

The upper stage 322 is configured to retain the substrates 210 and 230 via the substrate holders 220 and 240.

Similarly, the lower stage 332 is also configured to retain the substrates 210 and 230 via the substrate holders 220 and 240.

The upper stage 322 and the lower stage 332 may also be each configured to directly retain the substrates 210 and 230. In this case, the substrate holders may be fixed to the upper stage 322 and the lower stage 332.

In other words, when referring to the substrate holder, it may refer to a conveyable apparatus such as the substrate holders 220 and 240 or may refer to a non-conveyable apparatus such as provided fixed to the upper stage 322 and the lower stage 332.

The bonding unit 300 is configured to align the substrates 210 and 230 each other, the substrates 210 and 230 being respectively retained on the upper stage 322 and the lower stage 332.

Thereafter, the bonding unit 300 is configured to bring the substrates 210 and 230 into contact with each other and to bond the substrates by maintaining a state where one of the substrates 210 and 230 is retained by one of the upper stage 322 and the lower stage 332 and releasing a state where the other of the substrates 210 and 230 is retained by the other of the upper stage 322 and the lower stage 332.

Herein, the bonding state may refer to a state where terminals provided to stacked two substrates are connected to each other and electrical conduction is thereby secured between the two substrates.

In addition, the bonding state may also refer to a state where terminals provided to stacked two substrates are connected to each other and bonding strength of the two substrates becomes thereby predetermined strength or higher.

Further, in a case where two substrate terminals are electrically connected by performing a process such as anneal on stacked two substrates, the bonding state may refer to a state where the two substrates are tentatively bound, i.e., tentatively joined before the process such as anneal.

Further, in a case of forming terminals for electrical connection on two substrates after joining the two substrates, the bonding state may refer to a state where joining surfaces of the two substrates on which terminals are not formed are joined to each other.

Further, in a case where joining strength of two substrates becomes predetermined strength or higher by performing a process such as anneal on stacked two substrates, the bonding state may refer to the above-mentioned tentatively joined state before the process such as anneal.

The state where the joining strength becomes predetermined strength or higher by anneal includes a state where surfaces of two substrates are bound to each other by covalent binding, for example.

In addition, the tentatively joined state includes a state where overlapped two substrates can be separated and reused.

The prealigner 500 is configured to respectively align the substrates 210 and 230 and the substrate holders 220 and 240, and to cause the substrates 210 and 230 to be respectively retained on the substrate holders 220 and 240.

The control unit 150 is configured to collectively control each unit of the substrate bonding apparatus 100 in mutual cooperation.

The control unit 150 is also configured to receive a user's instruction from an outside, for example, and to set manufacturing conditions when manufacturing the stacked substrate 201.

The control unit 150 may further have a user interface configured to display an operation state of the substrate bonding apparatus 100 toward an outside user.

In the above-mentioned substrate bonding apparatus 100, not only the substrates 210 and 230 on which devices, circuits, terminals and the like are formed as described above but also a bare silicon that is an untreated silicon wafer on which structures are not formed, a SiGe substrate to which Ge is added, a Ge single crystal substrate, a compound semiconductor wafer of III-V groups, II-VI groups or the like, a glass substrate and the like can be bonded.

Targets to be bonded may be a circuit substrate and an untreated substrate or may be untreated substrates.

The substrates 210 and 230 to be bonded themselves may also be each the stacked substrate 201 having a plurality of substrates already stacked.

The substrates 210 and 230 to be bonded may have, for example, substantially the same contour dimensions each other in a state where distortion has not occurred.

Note that, the contours of the substrates 210 and 230 may be substantially circular shapes or other shapes.

FIGS. 2 to 6 are schematic cross-sectional views of the bonding unit 300.

A configuration of the bonding unit 300 of the present embodiment and an outline of a bonding process of the substrate 210 and the substrate 230 in the bonding unit 300 are described with reference to FIGS. 2 to 6.

In the present embodiment, as one example, the upper stage 322 of the bonding unit 300 is configured to retain the substrate 210 via the substrate holder 220, and the lower stage 332 is configured to retain the substrate 230 via the substrate holder 240.

Figure 2:
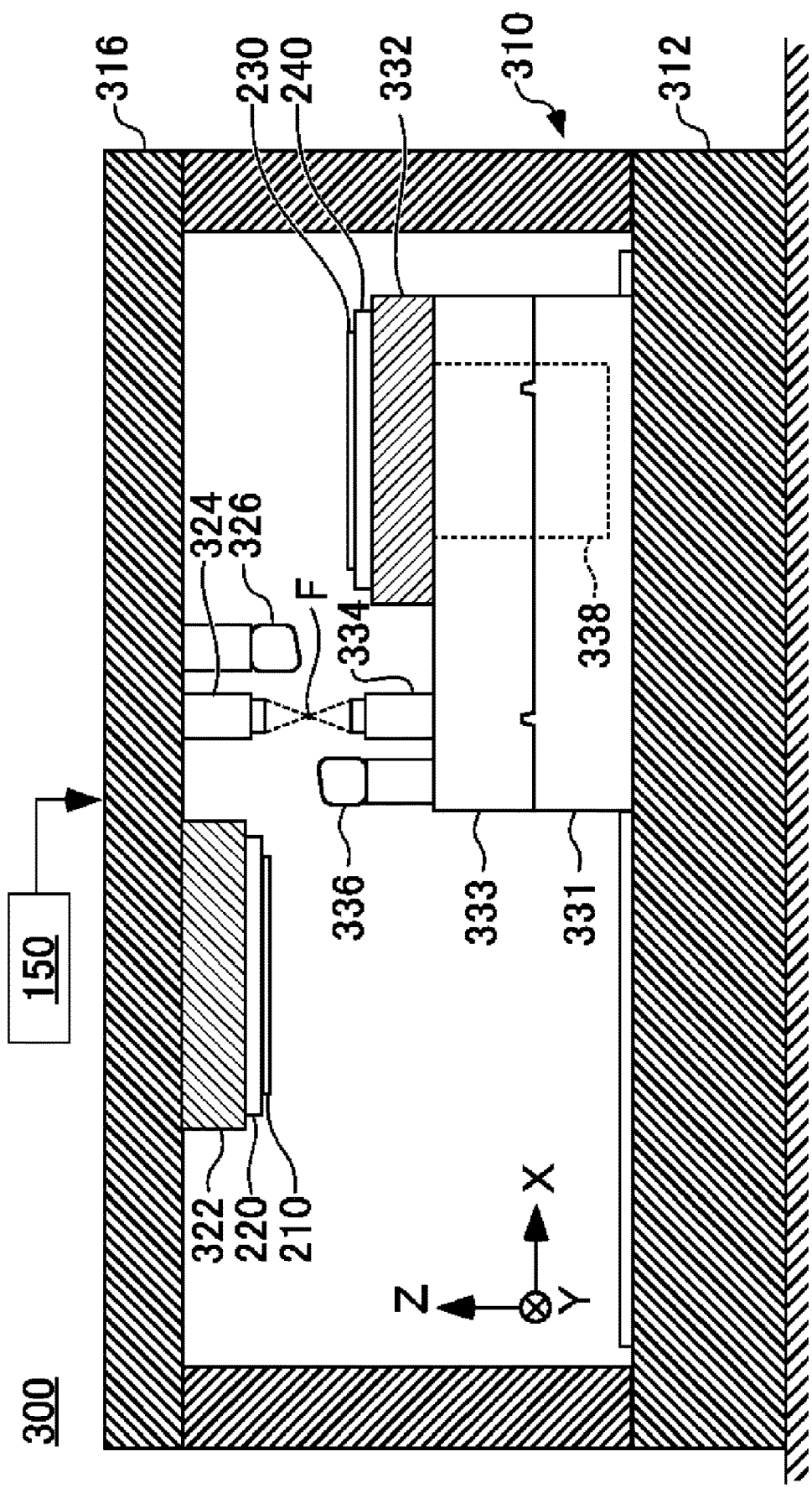
FIG. 2 is a schematic cross-sectional view of a bonding unit 300.

In the bonding process of the substrates 210 and 230, first, based on a command from the control unit 150, the conveying unit 140 is configured to import the substrate holder 220 retaining the substrate 210 into the bonding unit 300 and to cause the substrate holder 220 to be retained on the upper stage 322, and to import the substrate holder 240 retaining the substrate 230 into the bonding unit 300 and to cause the substrate holder 240 to be retained on the lower stage 332. FIG. 2 shows a state where the substrates are retained on the respective stages via the substrate holders.

The upper stage 322 has a retaining function of a vacuum chuck, an electrostatic chuck and the like, and is fixed downwardly oriented to a ceiling plate 316 of a frame 310. The lower stage 332 has a retaining function of a vacuum chuck, an electrostatic chuck and the like, and is loaded on an upper surface of a Y-direction driving unit 333 overlapped over an X-direction driving unit 331 arranged on a base plate 312 of the frame 310.

Note that, in FIGS. 2 to 6, the configuration of the support surfaces of the substrate holders 220 and 240 are simplified and shown flat.

On the ceiling plate 316, a microscope 324 and an activation apparatus 326 are fixed beside the upper stage 322.

The microscope 324 can observe an upper surface of the substrate 230 retained on the lower stage 332.

The activation apparatus 326 is configured to generate plasma for cleaning the upper surface of the substrate 230 indirectly retained on the lower stage 332.

In the activation apparatus 326, an oxygen gas that is a process gas is excited to turn into plasma in a reduced-pressure atmosphere, for example, and oxygen ions are irradiated to respective bonding surfaces of the two substrates, thereby disconnecting bonding of SiO on the bonding surface to form dangling bonds of Si and O, in a case where the substrate 230 is a wafer where an SiO film is formed on Si, for example.

The forming of such dangling bonds on the surface of the wafer may also be referred to as activation.

When exposed to the atmosphere in this state, the moisture in the air is bound to the dangling bonds, so that the surface of the substrate is covered with OH-groups.

Thereby, the surface of the wafer becomes in a state of being easier to bind to water molecules, i.e., in a state of being easier to be hydrophilized.

That is, the activation makes it easier for the surface of the wafer to be hydrophilic, as a result.

Although not shown, a hydrophilizing apparatus configured to hydrophilize the surface of the wafer is configured to apply, for example, pure water to each of the bonding surfaces of the two wafers, thereby hydrophilizing the bonding surfaces and cleaning the bonding surfaces.

The X-direction driving unit 331 is configured to move in a direction shown with an arrow X in the figure, in parallel to the base plate 312.

The Y-direction driving unit 333 is configured to move in a direction shown with an arrow Y in the figure, in parallel to the base plate 312 on the X-direction driving unit 331. By combining operations of the X-direction driving unit 331 and the Y-direction driving unit 333, the lower stage 332 is configured to move two-dimensionally, in parallel to the base plate 312.

In addition, the lower stage 332 is supported by a lift driving unit 338, and is configured to move up and down in a direction shown with an arrow Z in the figure by drive of the lift driving unit 338.

In this manner, the lower stage 332 is configured to displace relative positions of the substrate 230 retained on the substrate holder 240 and the substrate 210 retained on the substrate holder 220, between the lower stage 332 and the upper stage 322 configured to retain the substrate 210 via the substrate holder 220.

An amount of movement of the lower stage 332 by the X-direction driving unit 331, the Y-direction driving unit 333 and the lift driving unit 338 is accurately measured using an interferometer or the like.

The Y-direction driving unit 333 is loaded with each of a microscope 334 and an activation apparatus 336 beside the lower stage 332.

The microscope 334 can observe a surface that is a lower surface of the substrate 210 retained on the upper stage 322. The activation apparatus 336 is configured to generate plasma for cleaning the surface of the substrate 210.

Note that, the activation apparatuses 326 and 336 may be provided to another apparatus different from the bonding unit 300, and substrates whose surfaces have been activated and the substrate holders may be conveyed from the activation apparatuses 326 and 336 to the bonding unit 300 by a robot.

Note that, the bonding unit 300 may further include a rotation driving unit configured to rotate the lower stage 332 about a rotary shaft perpendicular to the base plate 312 and a swing driving unit configured to swing the lower stage 332.

Thereby, the aligning accuracy of the substrates 210 and 230 can be improved by making the lower stage 332 parallel to the upper stage 322 and rotating the substrate 230 retained on the lower stage 332.

The microscopes 324 and 334 are calibrated by focusing on each other and being caused to observe a common indicator by the control unit 150.

Thereby, relative positions of the pair of microscopes 324 and 334 in the bonding unit 300 are measured.

Figure 3:
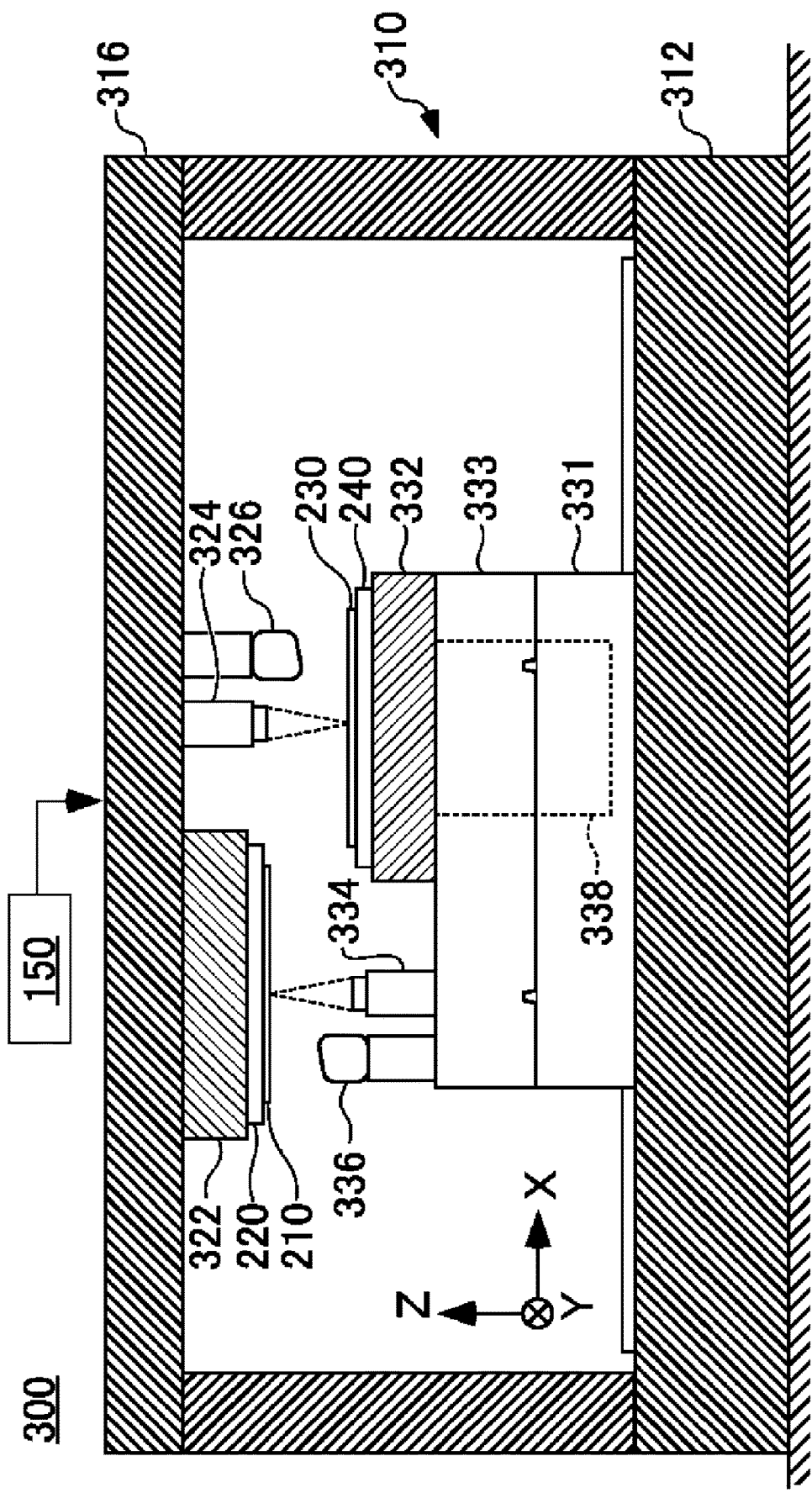
FIG. 3 is a schematic cross-sectional view of the bonding unit 300.

Subsequently to the state shown in FIG. 2, as shown in FIG. 3, the control unit 150 is configured to operate the X-direction driving unit 331 and the Y-direction driving unit 333, thereby causing the microscopes 324 and 334 whose relative positions are already known to detect the alignment marks provided to each of the substrate 210 and the substrate 230 and calculating relative positions of the substrate 210 and the substrate 230. Then, amounts of relative movement of the substrate 210 and the substrate 230 are calculated so that a positional deviation amount between the corresponding alignment marks of the substrate 210 and the substrate 230 is equal to or less than a predetermined threshold and a positional deviation amount of the corresponding connection structures between the substrate 210 and the substrate 230 is equal to or less than a predetermined threshold.

The positional deviation may refer to a positional deviation between the corresponding alignment marks of the bonded substrate 210 and the substrate 230 or may refer to a positional deviation between the corresponding connection structures of the bonded substrate 210 and substrate 230.

The positional deviation may be caused due to a difference in amount of distortions that occur in each of the two substrates 210 and 230.

Herein, the threshold may be a deviation amount that enables electrical conduction between the substrates 210 and 230 at the time when mutual bonding of the substrates 210 and 230 is completed or may be a deviation amount at the time when the structures respectively provided to the substrates 210 and 230 contact at at least a part. When the positional deviation between the substrates 210 and 230 becomes equal to or greater than the predetermined threshold, the control unit 150 may determine that it is in a state where the connection structures are not in contact with each other or appropriate electrical conduction is not obtained or a state where predetermined joining strength is not obtained between the connection structures.

Figure 4:
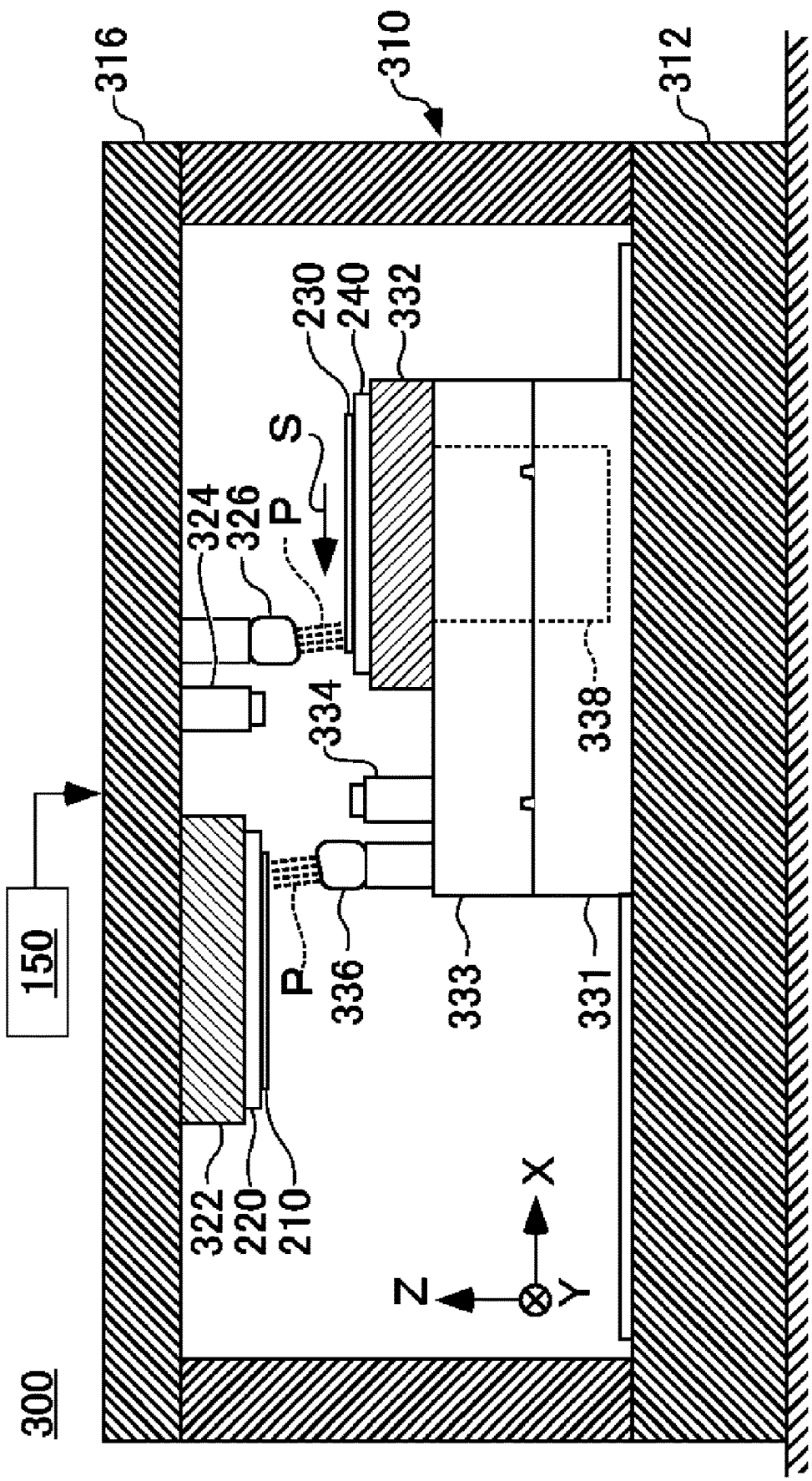
FIG. 4 is a schematic cross-sectional view of the bonding unit 300.

Subsequently to the state shown in FIG. 3, as shown in FIG. 4, the respective bonding surfaces of the substrate 210 and the substrate 230 are chemically activated.

The control unit 150 is configured to first reset a position of the lower stage 332 to an initial position and then to move the lower stage 332 horizontally, and to scan the surfaces of the substrate 210 and the substrate 230 by the plasma generated by the activation apparatuses 326 and 336. Thereby, the respective surfaces of the substrate 210 and the substrate 230 are cleaned, so that chemical activity increases.

Note that, the activation of the substrate 210 and the substrate 230 may be performed before the calculation of the relative positions between the substrates or may be performed before importing the substrate 210 and the substrate 230 into the substrate bonding apparatus 100.

The surfaces of the substrates 210 and 230 can also be activated by sputter etching using an inert gas, an ion beam, a high speed atom beam or the like, in addition to using a method of exposing to the plasma.

When using an ion beam or a high speed atom beam, it can be generated under reduced pressure of the bonding unit 300.

In addition, the substrates 210 and 230 can be activated by ultraviolet irradiation, ozone asher and the like.

Further, the substrates 210 and 230 can be activated by chemical cleaning the surfaces thereof using a liquid or gas etchant, for example.

After activating the surfaces of the substrates 210 and 230, the surfaces of the substrates 210 and 230 may be hydrophilized by a hydrophilizing apparatus.

Figure 5:
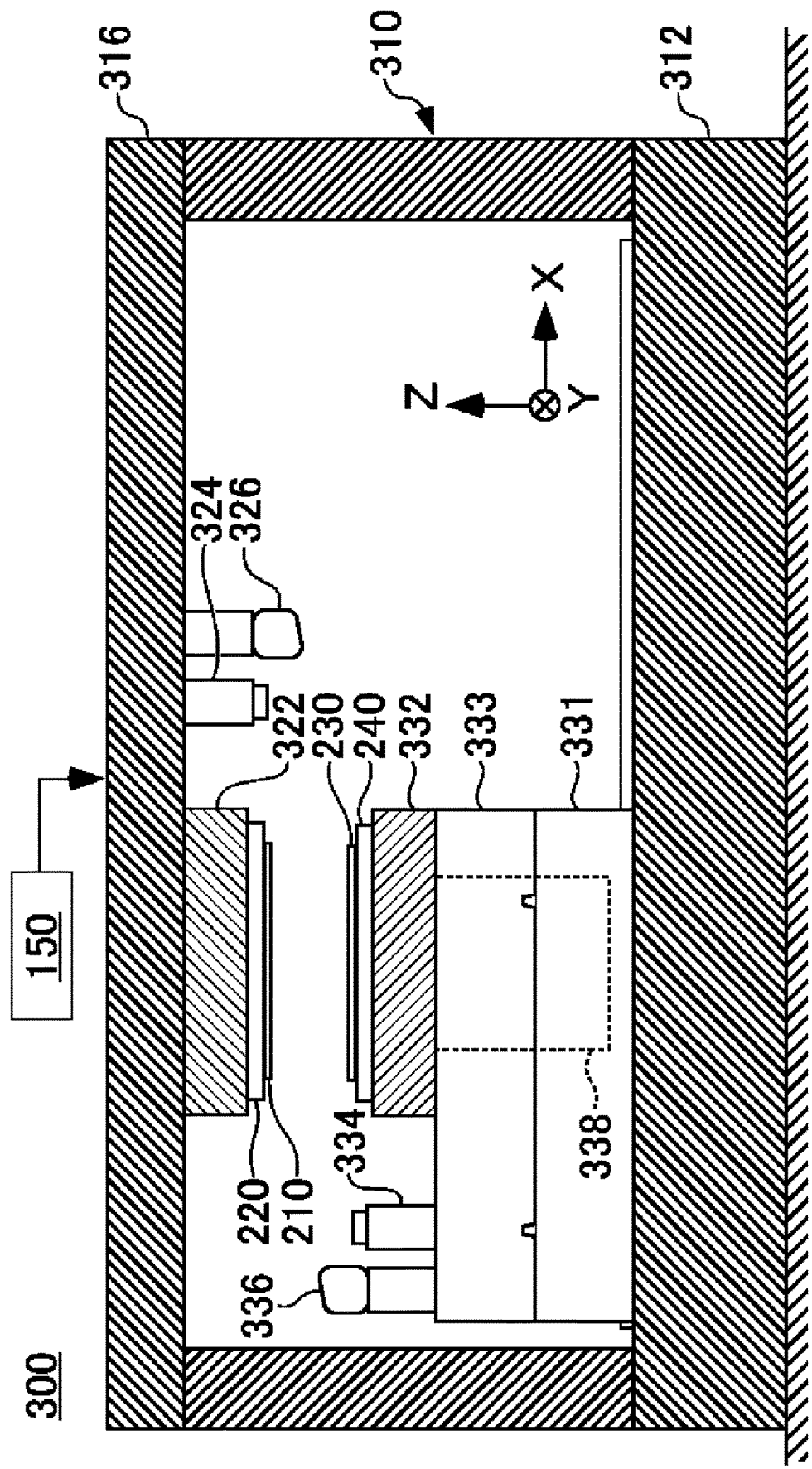
FIG. 5 is a schematic cross-sectional view of a bonding unit 300.

Subsequently to the state shown in FIG. 4, as shown in FIG. 5, the control unit 150 is configured to move the lower stage 332 to align the substrate 210 and the substrate 230 each other.

More specifically, the control unit 150 is configured to move the lower stage 332 so that the positions of the mutual alignment marks match, based on the relative positions of the microscopes 324 and 334 and the positions of the alignment marks of the substrates 210 and 230.

Figure 6:
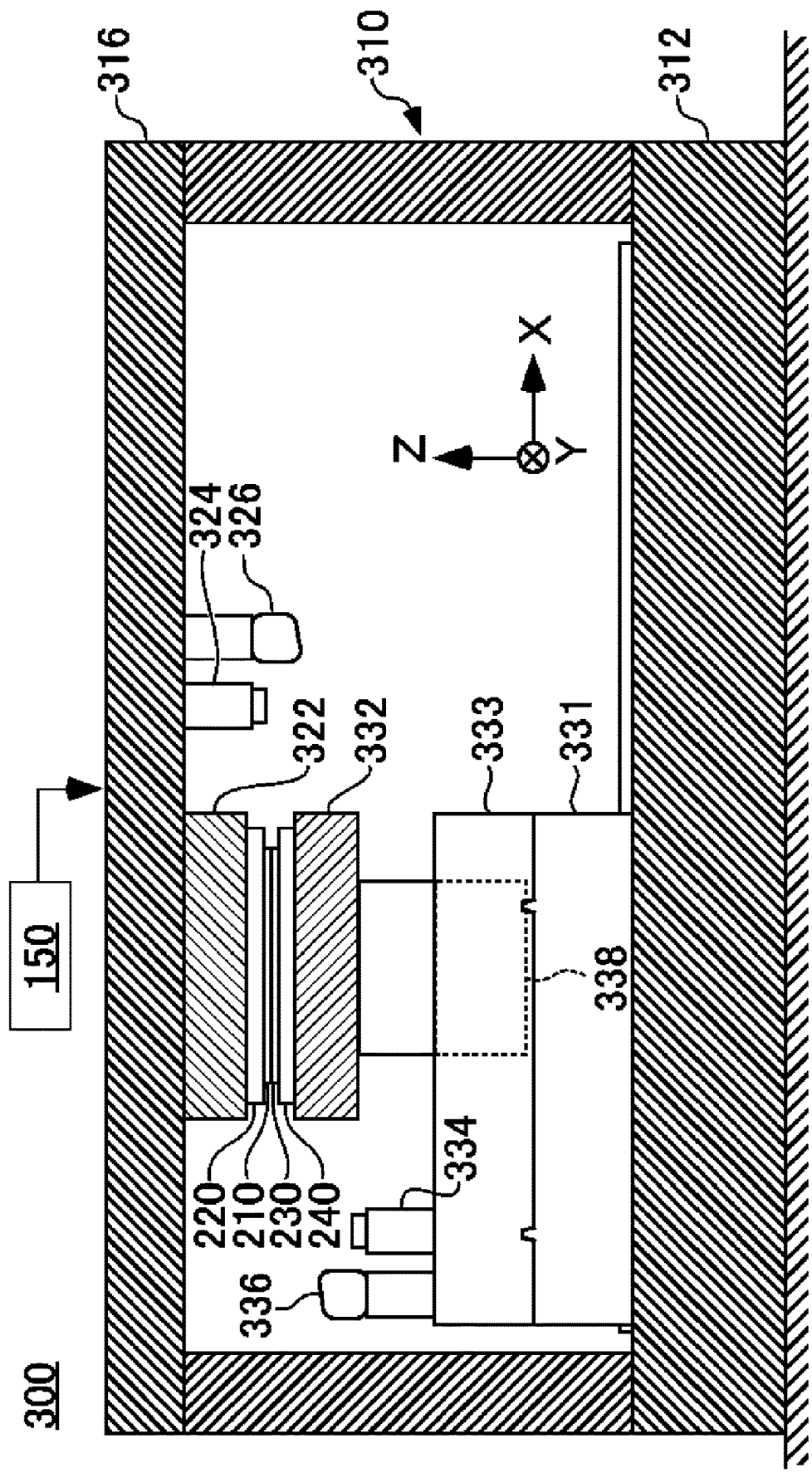
FIG. 6 is a schematic cross-sectional view of a bonding unit 300.

Subsequently to the state shown in FIG. 5, as shown in FIG. 6, the control unit 150 is configured to operate the lift driving unit 338 to move up the lower stage 332, thereby approaching the substrate 210 and the substrate 230 each other.

Then, after a part of the substrate 230 and a part of the substrate 210 are contacted to form a contact region, the contact region is enlarged to bond the substrate 230 and the substrate 210.

For example, in a case where the substrate holder 240 has a support surface having a centrally convex shape, after a protruding part of the substrate 230 deformed into a convex shape by following the curved support surface of the substrate holder 240 is contacted to the substrate 210 to form a contact region, the contact region is enlarged to bond the substrate 210 and the substrate 230 in a deformed state of the substrate 230.

More specifically, the substrate 210 and the substrate 230 are first approached to cause parts of the substrate 210 and the substrate 230 to contact each other, thereby forming a contact region at the contact place already activated.

In addition, by releasing the retaining of the substrate 210 by the substrate holder 220, regions adjacent to the contact places are autonomously adsorbed to each other by intermolecular force between the activated surfaces, and a bonding wave (BW) where the contact region sequentially spreads outward in radial directions of the substrate 210 and the substrate 230 occurs, whereby the substrate 210 and the substrate 230 are bonded in the deformed state of the substrate 230.

By using the substrate holder 240 having the support surface having the centrally convex shape, the substrate 210 and the substrate 230 are formed with only one contact place, so that occurrence of voids in the bonding surface resulting from separate formations of a plurality of contact places can be suppressed.

Note that, in the present embodiment, the bonding process includes a process after the substrate 210 and the substrate 230 contact each other at parts until the enlarging of the contact region ends.

Figure 7A:
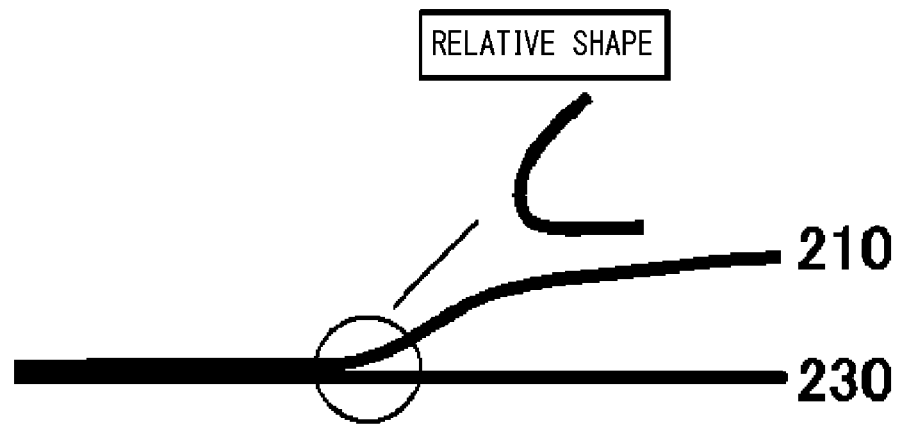
FIG. 7A is an illustration of enlarging of a contact region and relative shapes of upper and lower wafers.
Figure 7B:
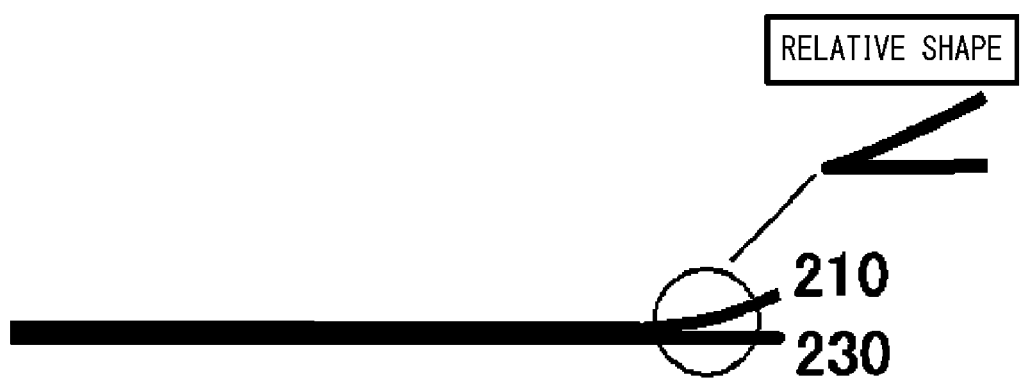
FIG. 7B is an illustration of enlarging of a contact region and relative shapes of upper and lower wafers.

FIG. 7A and FIG. 7B is an illustration of enlarging of a contact region and relative shapes of the substrates 210 and 230.

FIG. 7A shows a state where an outer peripheral portion of the contact region (i.e., an end portion in an advancing direction of BW in a cross-section) is still located closer to centers of the substrates 210 and 230, and FIG. 7B shows a state where the outer peripheral portion of the contact region has reached outer peripheral sides of the substrates 210 and 230.

Note that, in FIG. 7A and FIG. 7B, the upper and lower substrate holders are omitted.

In the state of FIG. 7A, the free upper substrate 210 that is not retained by the substrate holder is in a largely bent state due to a resistance of air intervening between the substrates.

On the other hand, in the state of FIG. 7B, since the outer peripheral portion of the contact region has reached the outer peripheral sides of the substrates 210 and 230, the air intervening between the substrates is emitted to an outside, whereby an aspect that the substrate 210 receives the air resistance has changed.

That is, on the outer peripheral sides of the substrates 210 and 230, an area receiving a resistance of the air intervening between the substrates is smaller than the area on the center sides of the substrates 210 and 230, so that the substrates are about to close therebetween while the substrate 210 remains in a planar (linear, as seen in a cross-section) form.

The uppers of FIG. 7A and FIG. 7B schematically illustrate relative shapes of the substrates 210 and 230 at the outer peripheral portion of the contact region, in each state. Comparing the two relative shapes, an interval between the substrates 210 and 230 in a position at any constant distance from the contact region toward the outer peripheral side is narrower in the state where the contact region is located on the outer peripheral side than in the state where the contact region is located on the center side.

When the interval between the substrates 210 and 230 is narrow, a gas such as air intervening between the substrates or a liquid such as water formed due to dew condensation is likely to increase in pressure and/or remains without being pushed out and becomes voids (also referred to as air bubbles) that can induce peeling of the stacked substrate.

In other words, circumferential portions between the substrates to be bonded have a higher risk of void occurrence than a central portion.

Note that, when bonding the substrates 210 and 230 of ϕ300 mm by using the substrate holders each having a retaining region (a region that contacts the substrate 230 maintaining the retaining in the bonding process) whose diameter is slightly smaller than the diameter, i.e., when there is an overhang portion, which is not retained by the substrate holder, at a circumferential edge of the substrate 230, test data showing that numerous voids occur on an inside several mm from a circumferential edge of the stacked substrate has been obtained.

Note that, even when there is no overhang portion, which is not retained by the substrate holder, at the circumferential edge of the substrate 230, voids may occur on the inside several mm from the circumferential edge of the stacked substrate.

Types of the voids that occur on the outer peripheral side of the stacked substrate include step voids and adiabatic expansion voids, for example.

The step void is a void that occurs, as the circumferential portions of the bonding surfaces of the substrates 210 and 230 are not flat and the gas such as air remains on the non-flat portions in the bonding process.

The adiabatic expansion void is a void that occurs, in the bonding process, as the gas including moisture having moved from the center sides toward the outer peripheral sides of the substrates 210 and 230 adiabatically expands due to a large change in pressure between an outside of the substrates 210 and 230 and rapidly lowers in temperature, resulting in dew condensation of the moisture.

Therefore, the adiabatic expansion void is a void whose occurrence risk increases as the BW speed increases or the air pressure between the upper and lower substrates increases.

Figure 8A:
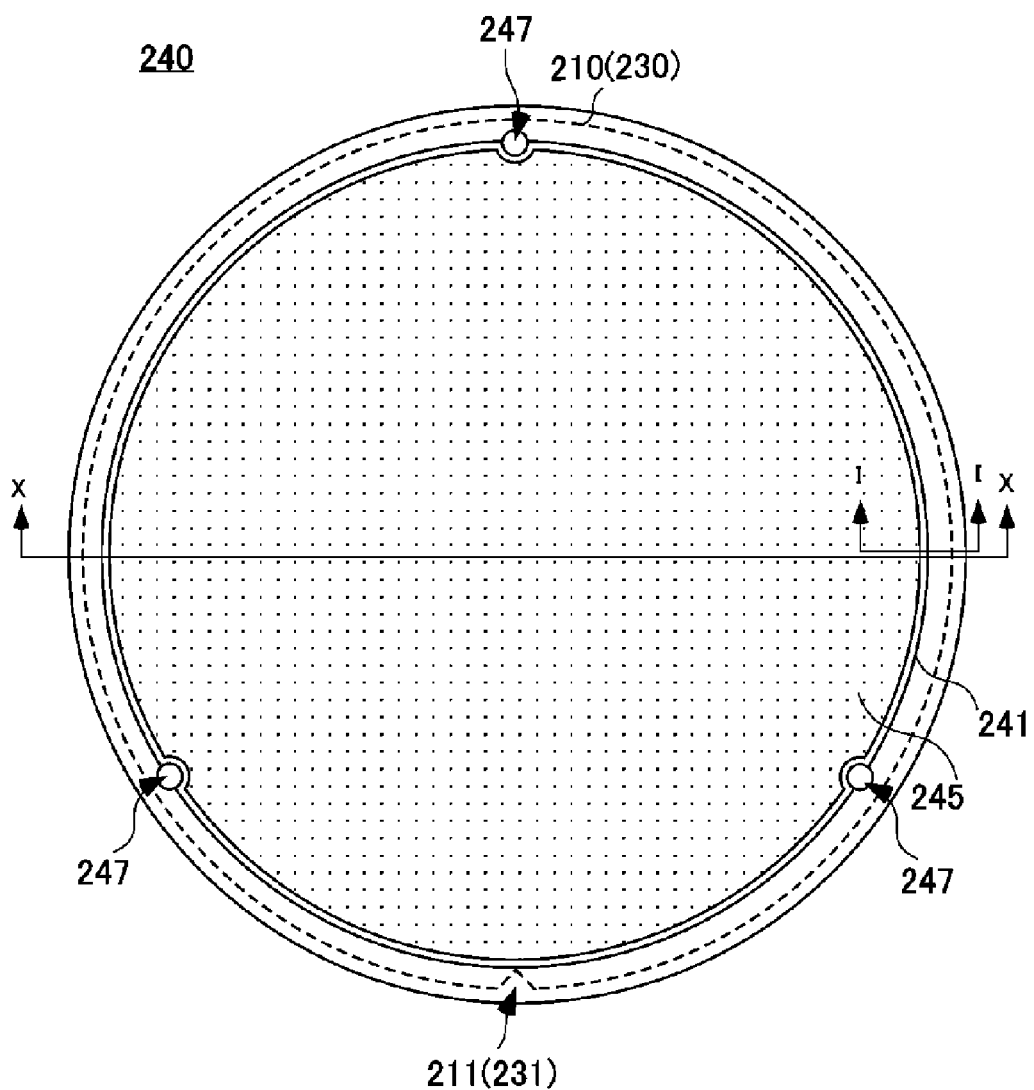
FIG. 8A is a schematic plan view of a substrate holder 240 that retains substrates 210 and 230 in a bonding process.
Figure 8B:
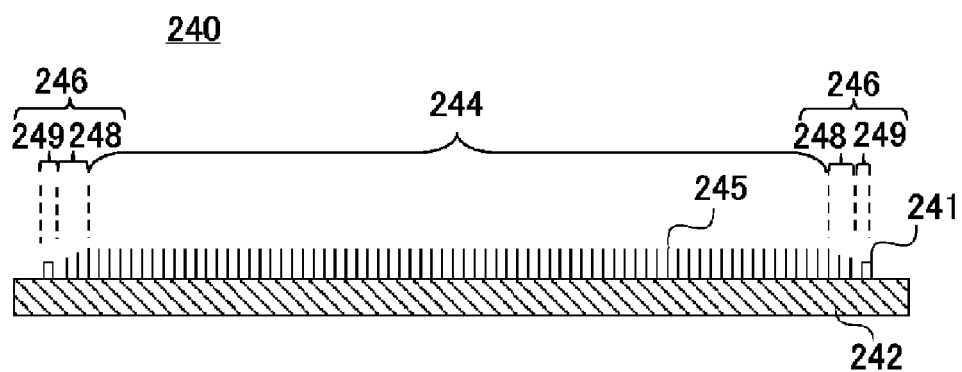
FIG. 8B is an X-X cross-sectional view of the substrate holder 240 shown in FIG. 8A.

FIG. 8(*a*) is a schematic plan view of the substrate holder 240 that retains substrates 210 and 230 in the bonding process, and FIG. 8(*b*) is an X-X cross-sectional view.

In FIG. 8, a long dashed short dashed line is shown between (a) and (b).

Figure 9:
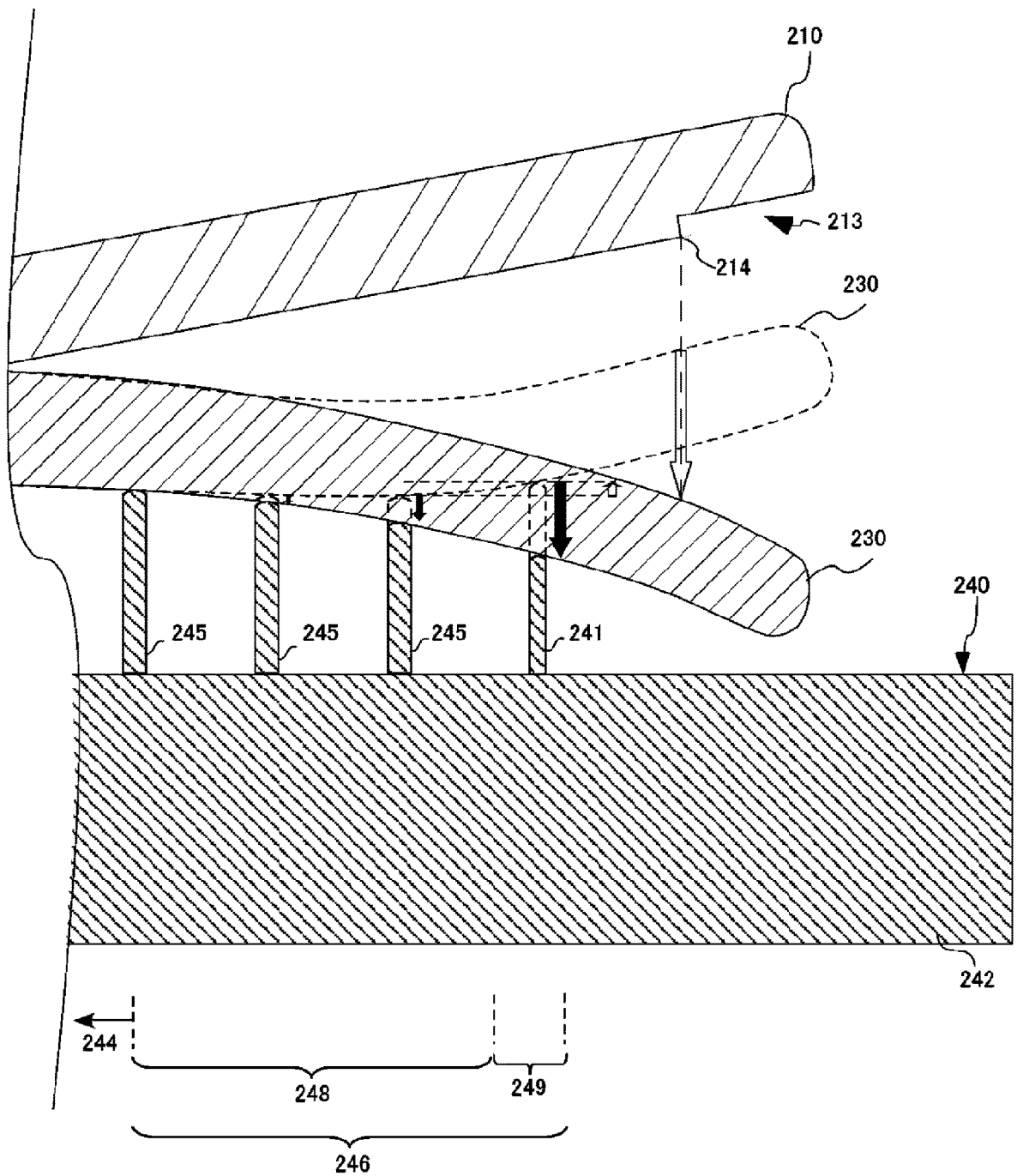
FIG. 9 is a schematic partially enlarged cross-sectional view for illustrating substrate interval enlarging of a bonding wave (BW) end position 214 of the substrates 210 and 230 in the bonding process using the substrate holder 240.

Also, FIG. 9 is a schematic partially enlarged cross-sectional view for illustrating substrate interval enlarging of a BW end position 214 of the substrates 210 and 230 in the bonding process using the substrate holder 240, and is a partially enlarged view of a cross section taken along a line I-I of FIG. 8(*a*)

In FIG. 8(*a*), a contour of the substrate holder 240 is schematically shown with a solid-line circle, and contours of the substrates 210 and 230 retained on the substrate holder 240 are schematically shown with a dashed line.

Also, in FIG. 9, the substrate holder 240 according to the present embodiment and the substrate 230 retained by the substrate holder 240 are shown with a solid line, and a substrate retained by a substrate holder of Comparative Example is shown with a dashed line.

In addition, in FIG. 9, an aspect where a height of a wall portion 241 of the substrate holder 240 and heights of a plurality of support pins 245 adjacent to the wall portion 241 on a center side according to the present embodiment are respectively formed lower than Comparative Example is shown with black arrows.

The substrate holder 240 has a substantially disc-shaped main body 242 formed of alumina or the like, and a central support portion 244 and an circumferential support portion 246, which are provided on one surface of the main body 242.

The central support portion 244 is configured to support a central portion, which is a region including a center of the substrate 230.

The circumferential support portion 246 is arranged on an outside of the central support portion 244 and is configured to support a circumferential portion on an outside of the central portion of the substrate 230.

The circumferential portion of the substrate 230 is at least a region from the BW end position 214 of the substrates 210 and 230 to a position distant by a predetermined distance toward an inside of the substrate 230, and is a region including positions in which voids occur.

The circumferential support portion 246 is configured to support the circumferential portion of the substrate 230 so that at least a partial region of the circumferential portion of the substrate 230 is curved toward the substrate holder 240 with a curvature greater than that of the central portion of the substrate 230.

In this case, the circumferential support portion 246 has a support surface on which a height of the substrate holder 240 becomes stepwise lower from the center side toward the circumferential side of the substrate holder 240, and is configured to support the circumferential portion of the substrate 230 by the support surface.

As regards the above-mentioned height of the substrate holder 240, in a case where the substrate holder 240 is provided with the plurality of support pins 245, like the present embodiment, an envelope surface passing through respective ends of the plurality of support pins 245 becomes a support surface for supporting the substrate 230, so that the height of the substrate holder 240 means a height of the support surface.

On the other hand, in a case where the substrate holder 240 is not provided with the plurality of support pins 245, unlike the present embodiment, the surface of the substrate holder 240 becomes a support surface for supporting the substrate 230, so that the height of the substrate holder 240 means a height of the support surface.

Herein, one example of the state where at least a partial region of the circumferential portion of the substrate 230 is curved toward the substrate holder 240 with a curvature greater than that of the central portion of the substrate 230 is a state where a curvature of a curve of a certain region (i.e., local) of the substrate 230 is greater than a curvature of an entire (i.e., global) curve of the central portion of the substrate 230. This can be said that the substrate holder 240 supports the circumferential portion of the substrate 230 while bending the circumferential portion toward the substrate holder 240 with a curvature greater than a curvature of the central portion of the substrate 230.

In a case where a curvature of a curve of the central portion is different depending on regions, a representative value such as an average value of the curvatures may be the curvature of the central portion, or an entire curvature may be calculated without calculating curvatures of regions with a predetermined magnitude or smaller.

Note that, in a case where the central portion is flat, the curvature is 0.

The central support portion 244 has a plurality of support pins 245 arranged at the center of the substrate holder 240. The circumferential support portion 246 has an annular wall portion 241 configured to support the circumferential side of the circumferential portion of the substrate 230 including the above-mentioned at least partial region.

That is, the plurality of support pins 245 is arranged on the inside of the annular wall portion 241.

The plurality of support pins 245 may be formed at equal intervals in the circumferential direction and in the radial direction of the substrate holder 240.

The plurality of support pins 245 may be arranged in a ring belt shape forming a plurality of rows in the radial direction or may be arranged in a zigzag shape.

Note that, in a case where the substrate holder 240 is an electrostatic adsorption type and the support pins 245 and the wall portion 241 are not provided on the support surface, the central support portion 244 may be a center region of the substrate holder 240, and the circumferential support portion 246 may be a region having a curved surface located on the outer peripheral side of the substrate holder 240, a step-like region having a plurality of step portions whose steps become lower outward in the radial direction, a region having a surface whose curvature is variable, or the like.

In addition, the circumferential support portion of the substrate holder 240 is formed with three holes 247 at intervals of 120 degrees in which lift-up pins for pushing the circumferential portion of the substrate 230 to be retained are inserted.

As shown in FIG. 8, in the present embodiment, the three holes 247 are located on the same circle as the annular wall portion 241, and the wall portion 241 bypasses surroundings of the three holes 247 toward the center side of the substrate holder 240.

As shown in FIG. 8, the circumferential portions of the substrates 210 and 230 are formed with notches 211 and 231 for indicating crystal orientations of the substrates 210 and 230.

FIG. 8 shows a state where the notches 211 and 231 of the substrates 210 and 230 are aligned each other.

Also, as shown in FIG. 9, the circumferential edge of the bonding surface of the substrate 210 is formed with an annular step portion 213 formed by trimming. The step portion 213 of the substrate 210 is a region that is not bonded to the substrate 230, and an end portion on a center side of the step portion 213 is a terminating end on the outer peripheral side of the flat bonding surface and is a position in which BW ends. In descriptions below, the position that is a terminating end on the outer peripheral side of the flat bonding surface and in which BW ends may be referred to as 'BW end position 214'.

The circumferential support portion 246 of the substrate holder 240 has an inner region 248 arranged adjacent to the above mentioned central support portion 244 and an outer region 249 arranged on an outside of the inner region 248. As described above, the circumferential support portion 246 has the support surface on which the height of the substrate holder 240 becomes stepwise lower from the center side toward the circumferential side of the substrate holder 240, and is configured to support the circumferential portion of the substrate 230 by the support surface.

In other words, a rate of change of the height of the support surface of the circumferential support portion 246 to a change in distance from the center of the central support portion 244 is greater than a rate of change of the height of the support surface of the central support portion 244 to the change in distance from the center of the central support portion 244.

Further, in other words, the circumferential portion of the substrate 230 is supported so that the circumferential portion of the substrate 230 is gradually curved toward the substrate holder 240 from a portion supported in the inner region 248 to a portion supported in the outer region 249.

Further, in other words, the circumferential portion of the substrate 230 is supported so that the portion, which is supported by the outer region 249, of the circumferential portion of the substrate 230 is curved toward the substrate holder 240 with a curvature greater than that of the portion supported by the inner region 248.

Therefore, a height of the inner region 248 is lower than a height of the central support portion 244, and a height of the outer region 249 is lower than the height of the inner region 248.

In addition, an amount of change or a rate of change in height positions of ends of the plurality of support pins 245 along a radially outward direction from the center toward the outer circumference of the substrate holder 240 in each of the central support portion 244, the inner region 248 and the outer region 249 may be constant.

Alternatively, the amount of change or rate of change may be greater in the inner region 248 than in the central support portion 244 and greater in the outer region 249 than in the inner region 248 or the same in the inner region 248 and in the outer region 249.

The inner region 248 has the plurality of support pins 245 at which the height of the substrate holder 240 becomes stepwise lower from the center side toward the circumferential side of the substrate holder 240 so that bonding surface of the substrate 230 is deformed in a convex shape. Thereby, the circumferential portion of the substrate 230 is supported by a virtual support surface formed by the plurality of support pins 245.

In other words, the circumferential support portion 246 has the plurality of support pins 245 whose virtual support surface is a curved surface and is configured to support the circumferential portion of the substrate 230 by the curved surface so that at least a partial region is curved toward the substrate holder 240 with a curvature greater than that of the central portion of the substrate 230.

In the shown example, the circumferential support portion 246 has, in the inner region 248, the plurality of support pins 245 whose heights become stepwise lower toward the outer peripheral side so that the bonding surface of the substrate 230 is deformed upward in FIG. 9 in a convex shape toward the substrate 210, and has the annular wall portion 241 in the outer region 249.

Note that, as shown, it is desirable for the above-mentioned virtual support surface to have a shape that has a curvature all the time, like a quadratic curve, and to have a configuration where the height thereof is gradually lowered.

Note that, as used herein, the virtual support surface herein indicates the above-described support surface.

In contrast, in a substrate holder of Comparative Example, the wall portion 241 is higher than the support pins 245 adjacent on a further inside than the wall portion 241. This is because, for example, even though it is intended to polish the plurality of support pins 245 and the wall portion 241 by a rotating polishing head so that the support surface becomes flat, a density in the circumferential direction of the wall portion 241 is greater than a density in the circumferential direction of the plurality of support pins 245, so that the wall portion 241 on the outer peripheral side becomes higher than the support pins 245 on the inside.

When bonding the substrates 210 and 230 by using the substrate holder 240 of the present embodiment, the bonding surface of the substrate 230 in the BW end position 214 becomes considerably lower and the interval between the substrate 210 and the substrate 230 become wider, as compared to Comparative Example, as shown with an outlined arrow in FIG. 9.

As described above, the substrate holder 240 of the present embodiment includes the circumferential support portion 246 arranged on the outside of the central support portion configured to support the central portion of the substrate 230 and configured to support the circumferential portion on the outside of the central portion of the substrate 230.

The circumferential support portion 246 is configured to support the circumferential portion of the substrate 230 so that at least a partial region of the circumferential portion of the substrate 230 is curved toward the substrate holder 240 with a curvature greater than that of the central portion of the substrate 230.

Thereby, the substrate holder 240 can form a space, which is similar to the wide space between the substrate 210 and the substrate 230 on the center side as shown in FIG. 7A, also on the outer peripheral side.

That is, also on the outer peripheral side, the substrate holder 240 can escape a fluid such as a gas and a liquid in the space between the substrate 210 and the substrate 230 to the outside while maintaining the relative shape of the substrate 210 and the substrate 230 as shown in FIG. 7A or by further increasing the interval between the substrate 210 and the substrate 230.

Therefore, the substrate holder 240 can lower a risk that voids will occur on the outer peripheral side of the stacked substrate 201 where the substrates 210 and 230 are bonded.

In addition, the substrate holder 240 can prevent an increase in pressure between the substrate 210 and the substrate 230 and/or lengthen a time until the substrate 210 is bonded to the substrate 230 by increasing the distance between the substrate 210 and the substrate 230 on the outer peripheral side.

Therefore, the substrate holder 240 can reduce a pressure difference between the pressure between the substrates on the outer peripheral side and the pressure on the outside of both the substrates, and/or lower the advancing speed of BW, thereby lowering the occurrence risk of the adiabatic expansion voids.

That is, the configuration of the circumferential support portion 246 that supports the circumferential portion of the substrate 230 so that at least a partial region of the circumferential portion of the substrate 230 is curved toward the substrate holder 240 with a curvature greater than that of the central portion of the substrate 230 can be said as a speed reduction portion configured to reduce at least one of an advancing speed of enlarging of the contact region at the circumferential portion on the outside of the central portion of the substrate 230 and a movement speed of a fluid, for example, a gas or a liquid between the substrate 230 and the substrate 210.

In addition, the configuration also functions as a release portion configured to release, to an outside of the substrate 230 and the substrate 210, a fluid moving between the substrate 230 and the substrate 210 by the enlarging of the contact region.

In a case where the substrate holder 240 of the present embodiment has a circular contour having a diameter of about 300 mm, from a standpoint of reducing voids, it was experimentally turned out that a range of 200 nm to 700 nm is preferable as a drop from a height in a position of a radius 146 mm to a height in a position of a radius 148 mm and a range of 500 nm to 2000 nm is preferable as a drop from a height in a position of a radius 146 mm to a height in a position of about a radius 150 mm, i.e., a height of the circumferential edge of the substrate holder 240.

Note that, as described above, the substrate bonding apparatus 100 of the present embodiment is configured to execute a bonding method comprising at least following each step when bonding the substrate 230 and the substrate 210 by using the substrate holder 240.

The bonding method comprises a step of retaining the substrate 230 by the substrate holder 240, wherein, by the substrate holder 240, the central portion of the substrate 230 is retained and the circumferential portion of the substrate 230 is retained so that at least a partial region of the circumferential portion on an outside of the central portion of the substrate 230 is curved toward the substrate holder 240 with a curvature greater than that of the central portion of the substrate 230.

The bonding method further comprises a step of retaining the substrate 210 by the substrate holder 220.

The bonding method further comprises a substrate bonding step of, after bringing a part of the substrate 230 and a part of the substrate 210 into contact with each other to form a contact region, bonding the substrate 230 and the substrate 210 by enlarging the contact region.

Note that, the circumferential support portion 246 of the substrate holder 240 may not have the plurality of support pins 245 whose heights become gradually lower. That is, the heights of the support pins 245 may be constant.

Also in this case, the annular wall portion 241 is made lower than the support pins 245. The circumferential portion of the substrate 230 retained on the substrate holder 240 may be curved toward the substrate 230 at the plurality of support pins 245 located in the circumferential direction on the most outer peripheral side as a fulcrum, to linearly extend on the inside and outside of the wall portion 241 or may be curved at the wall portion 241, as a further fulcrum.

Figure 10:
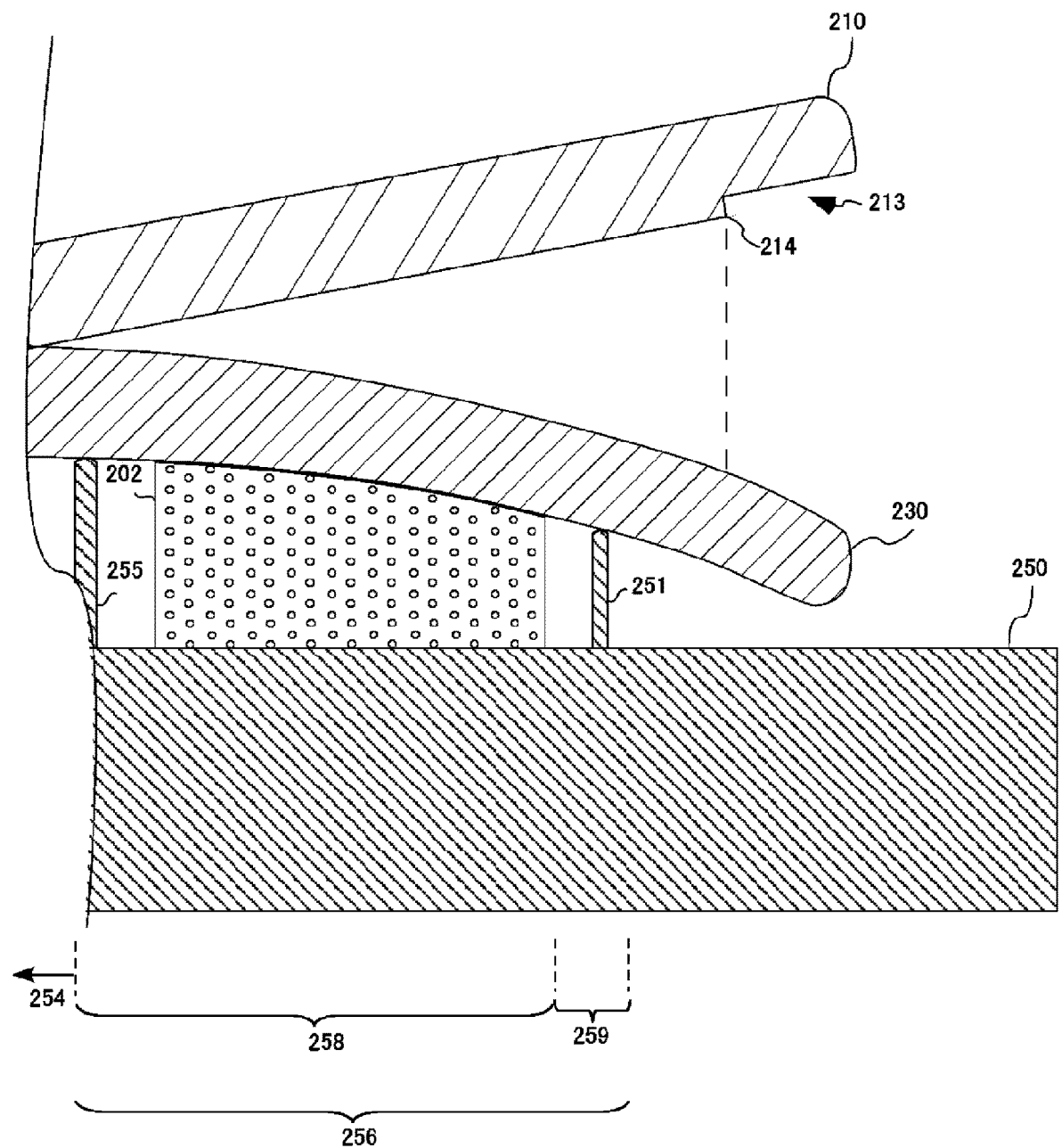
FIG. 10 is a schematic partially enlarged cross-sectional view of the BW end position 214 of the substrates 210 and 230 in the bonding process using a substrate holder 250.

FIG. 10 is a schematic partially enlarged cross-sectional view of the BW end position 214 of the substrates 210 and 230 in the bonding process using a substrate holder 250 of another embodiment.

As a difference of the substrate holder 250 from the substrate holder 240 described with reference to FIGS. 8 and 9, an circumferential support portion 256 additionally or alternatively has a smooth curved surface configured to support the circumferential portion of the substrate 230 so that at least a partial region of the substrate 230 is smoothly curved toward the substrate holder 250 with a curvature greater than that of the central portion of the substrate 230.

In a case where the substrate holder 250 is a vacuum adsorption type, the curved surface includes a plurality of ventilation holes and is able to adsorb the circumferential portion of the substrate 230 by a negative pressure.

As a more specific example shown in FIG. 10, the circumferential support portion 256 of the substrate holder 250 has, in an inner region 258, a support 202 having a plurality of ventilation holes formed thereon, and a support surface of the substrate 230 on the support 202 has the above-mentioned curved surface.

The support 202 may be formed of a porous material, as one example.

A height of the support 202 may smoothly vary between a height of the adjacent support pin 255 and a height of the wall portion 251, from a side of a central support portion 254 toward the outer peripheral side.

The support surface of the support 202 may be located on a quadratic curve having an upward convex shape connecting the support surface of the adjacent support pin 255 and the support surface of the wall portion 251.

The substrate holder 250 of the present embodiment exhibits the similar effects to the substrate holder 240 described with reference to FIGS. 8 and 9, and may additionally exhibit an effect capable of further smoothly curving the bonding surface of the substrate 230 to be retained.

Note that, in the embodiment where the circumferential support portion 246 of the substrate holder 250 has the support 202 in the inner region 258, in the example of FIG. 10, the substrate holder 250 has the wall portion 251 in the outer region 259.

However, instead of this, the substrate holder 250 may not have the wall portion 251.

In a case where the substrate holder 250 is a vacuum adsorption type and does not have the wall portion 251 as described above, the adsorption of the substrate 230 by the negative pressure may be enhanced by adding an air-impermeable member for sealing an outer peripheral side of the support 202, for example.

Note that, the member may be or may not be in contact with the substrate 230.

Figure 11:
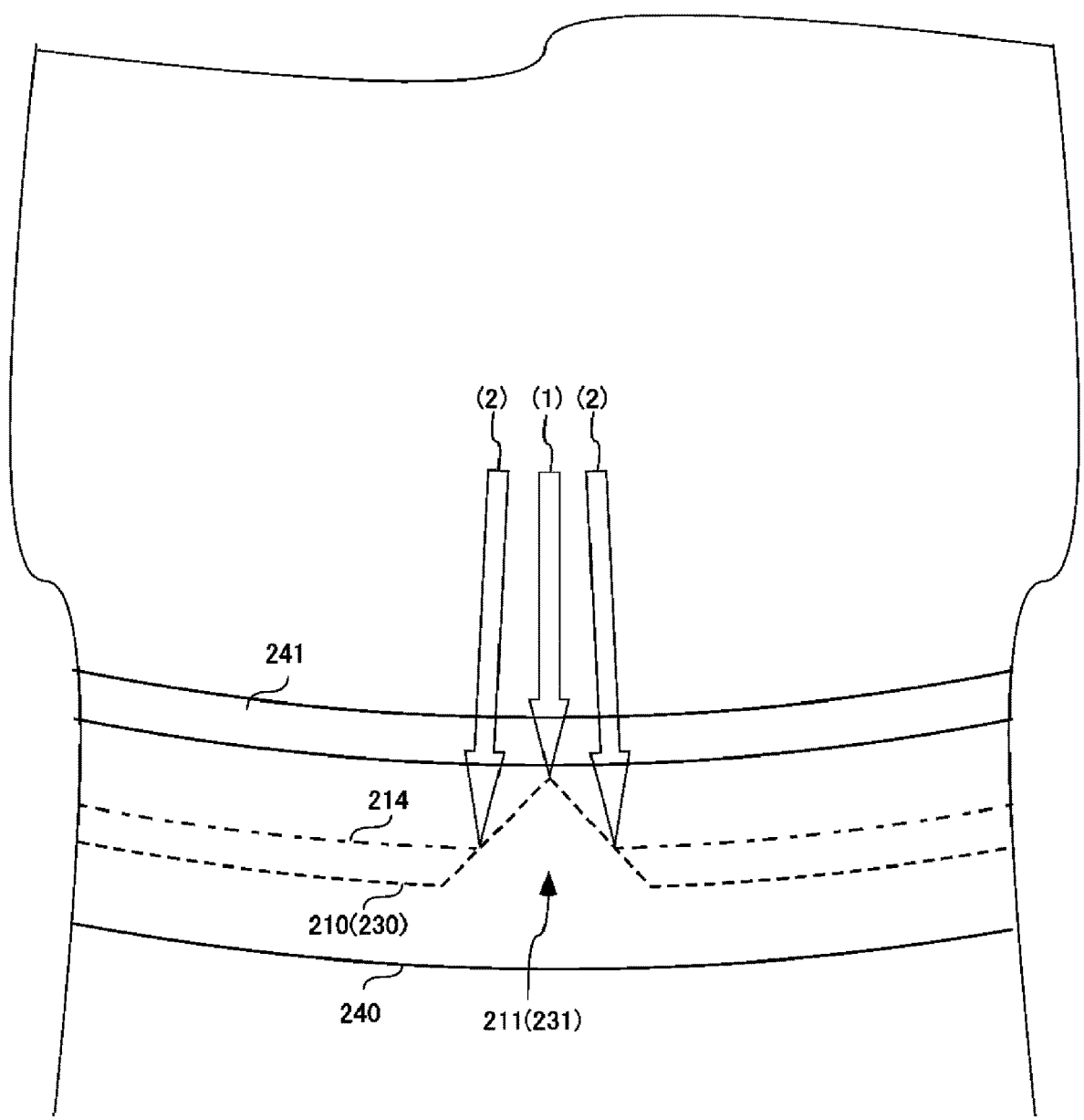
FIG. 11 is a schematic partially enlarged plan view for illustrating a difference of the BW end position 214 around notches 211 and 231, and an occurrence risk of adiabatic expansion voids due to the difference.

FIG. 11 is a schematic partially enlarged plan view for illustrating a difference of the BW end position 214 around notches 211 and 231, and an occurrence risk of adiabatic expansion voids due to the difference.

In FIG. 11, a length of time until the BW ends is indicated by a length of an outlined arrow, and it is meant that the longer the arrow is, the longer it takes for the BW to end. In FIG. 11, a length of time until the BW ends on sides closest to centers of the notches 211 and 231 is indicated by an outlined arrow (1), and lengths of time until the BW ends around the sides are indicated by outlined arrows (2).

As shown with the long dashed short dashed line in FIG. 11, the BW end position 214 becomes the same as the contours of the notches 211 and 231 at the centers of the notches 211 and 231.

Therefore, at the centers of the notches 211 and 231, the distance from the centers of the substrates 210 and 230 to the BW end position 214 is shortest, as compared to the surroundings of the centers of the notches.

Therefore, the BW at the centers of the notches 211 and 231 reaches the BW end position 214 at the earliest, and the circumferential side of the substrate 210 at the place is closed in a planar state (linear, as seen in a cross section) at the earliest.

As a result, the gas or liquid between the substrates 210 and 230 rapidly flows to the surrounding, so that a difference between the pressure between the surrounding substrates 210 and 230 and the atmospheric pressure rapidly increases. Then, between the surrounding substrates 210 and 230, a larger pressure drop occurs when the BW reaches the vicinity of the BW end position 214, as compared to a region in which the notches 211 and 231 are not formed, so that more adiabatic expansion voids may occurs.

Figure 12:
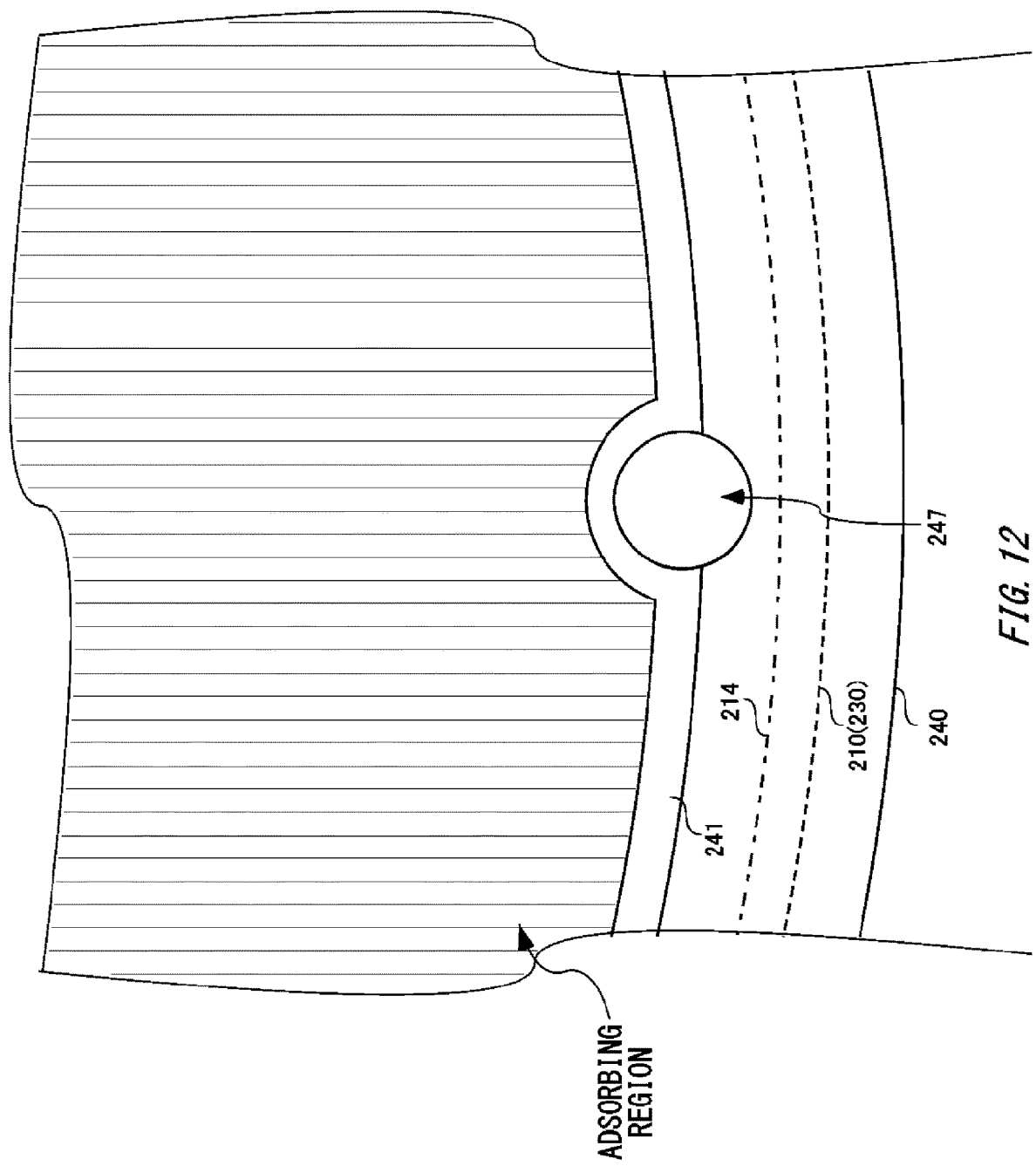
FIG. 12 is a schematic partially enlarged plan view for illustrating a change of an adsorbing region around a hole 247 of the substrate holder 240, and an occurrence risk of adiabatic expansion voids due to the change.

FIG. 12 is a schematic partially enlarged plan view for illustrating a change of an adsorbing region around the hole 247 of the substrate holder 240, and an occurrence risk of adiabatic expansion voids due to the change.

In FIG. 12, a region in which the substrate holder 240 adsorbs the substrate 230, i.e., the adsorbing region is shown with vertical stripes.

As described above, in the substrate holder 240 of the present embodiment, the hole 247 is located on the same circle as the annular wall portion 241, and the wall portion 241 bypasses the surrounding of the hole 247 toward the center side of the substrate holder 240.

Therefore, in the surrounding of the hole 247, the adsorbing region changes to be small toward the center side of the substrate holder 240, and the BW advances relatively fast on the center side around the hole 247.

However, due to the BW that advances relatively slow in other regions around the hole 247, the closing is delayed on the center side around the hole 247, so that the adiabatic expansion voids are reduced.

On the contrary, in the other regions described above, a region may be generated which is attracted toward the substrate 210 by the BW that has advanced earlier on the center side around the hole 247, and in which the final closing operation is accelerated, the advancing of the BW is disturbed and the adiabatic expansion voids are concentrated.

As described with reference to FIGS. 11 and 12, the substrates 210 and 230 that are bonded by enlarging the contact region have regions in which the adiabatic expansion voids are likely to occur due to various factors such as a discontinuous shape of the support surface of the substrate holder 240 and discontinuous contours of the substrates 210 and 230.

In the bonding process, preferably, in such region, a board-to-board distance is widened, as compared to other regions, for example, the height of the support pin 245 corresponding to the region is made lower than the height of the support pin 245 corresponding to other regions, i.e., the substrate 230 that is retained by the substrate holder 240 is bent toward the substrate holder 240 with a greater curvature.

Figure 13:
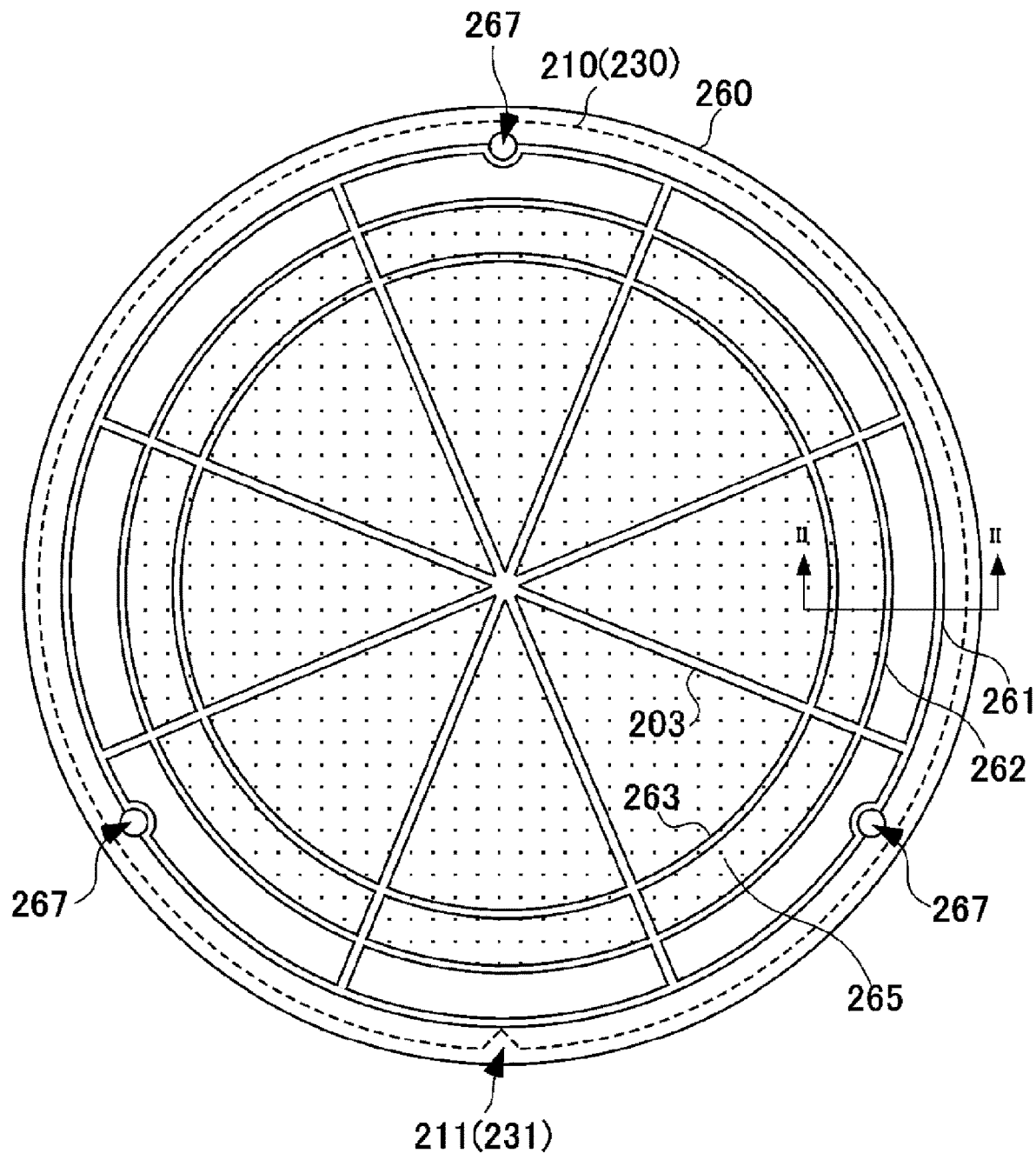
FIG. 13 is a schematic plan view of a substrate holder 260 that retains the substrates 210 and 230 in the bonding process.

FIG. 13 is a schematic plan view of a substrate holder 260 of still another embodiment.

Figure 14:
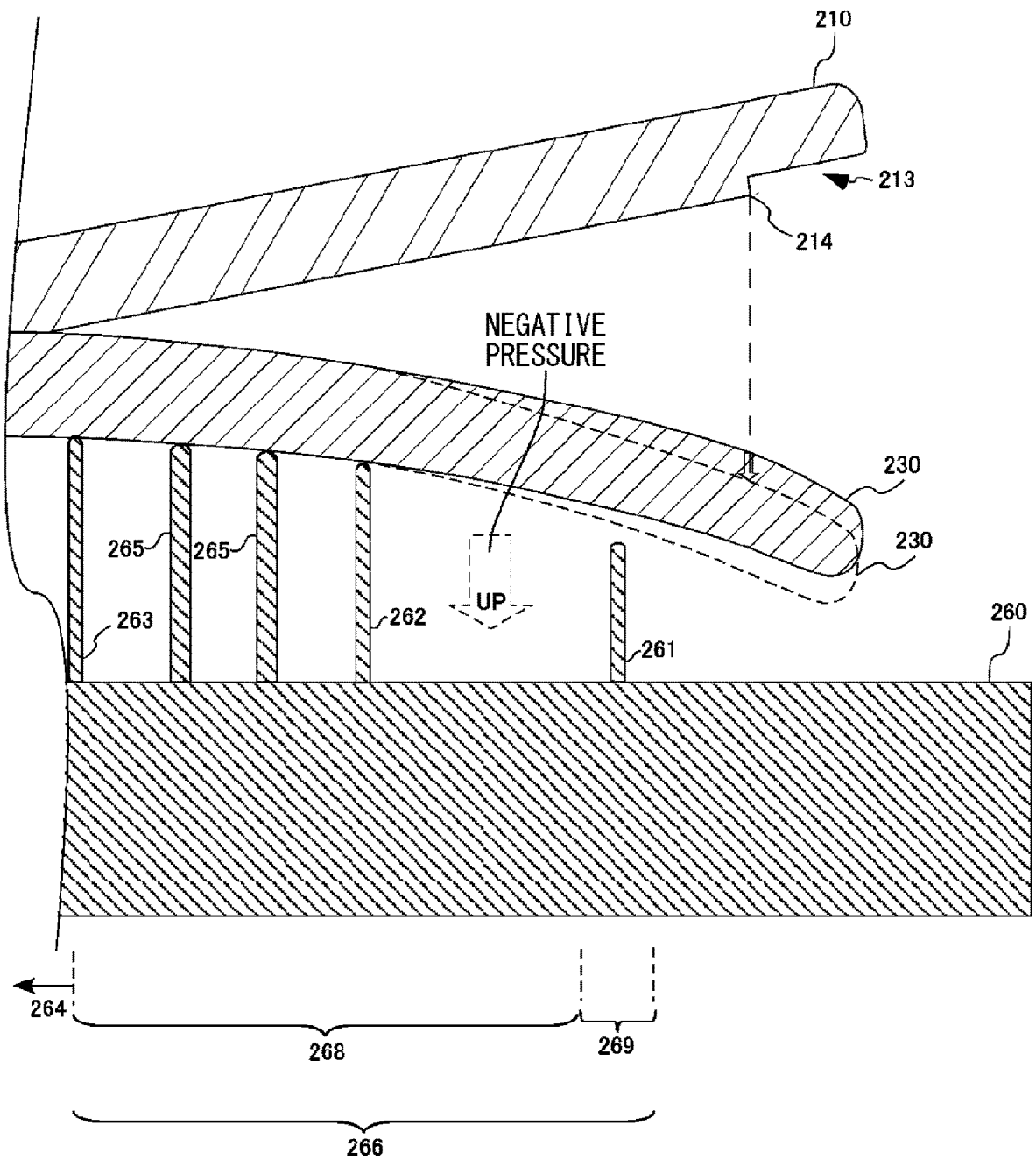
FIG. 14 is a schematic partially enlarged cross-sectional view for illustrating substrate interval adjustment of the BW end position 214 of the substrates 210 and 230 in the bonding process using the substrate holder 260.

Also, FIG. 14 is a schematic partially enlarged cross-sectional view for illustrating substrate interval adjustment of the BW end position 214 of the substrates 210 and 230 in the bonding process using the substrate holder 260, and is a partially enlarged view of a cross section taken along a line II-II of FIG. 13.

As a difference of the substrate holder 260 of the present embodiment from the substrate holder 240 described with reference to FIGS. 8 and 9, an circumferential support portion 266 additionally or alternatively includes a plurality of adsorbing regions, each of which can individually adsorb the circumferential portion of the substrate 230, in an inner region 268.

Note that, the circumferential support portion 266 of the substrate holder 260 includes a first wall portion 261 in an outer region 269, like the substrate holder 240.

In the specific example shown in FIG. 13, the substrate holder 260 includes an annular first wall portion 261 located on the outermost side, an annular second wall portion 262 located closer to a center than the first wall portion 261, an annular third wall portion 263 located closer to a center than the second wall portion 262, and radial separating portions 203 intersecting with the first wall portion 261, the second wall portion 262 and the third wall portion 263 and extending linearly in the radial direction over both a central support portion 264 and an circumferential support portion 266. The radial separating portions 203 may be, as one example, a plurality of walls extending at intervals of 45 degrees in the circumferential direction. Thereby, the circumferential support portion 266 of the substrate holder 260 has, in the inner region 268, an adsorbing region between the first wall portion 261 and the second wall portion 262 and an adsorbing region between the second wall portion 262 and the third wall portion 263, each of the adsorbing regions being equally divided into eight in the circumferential direction, and the central support portion 264 has an inside adsorbing region, each of which is equally divided into eight in the circumferential direction, of the annular third wall portion 263.

In addition, the circumferential support portion 266 of the substrate holder 260 has, as one example, a plurality of support pins 265 in the adsorbing region between the second wall portion 262 and the third wall portion 263 but does not have the support pins in the adsorbing region between the first wall portion 261 and the second wall portion 262.

Furthermore, as shown in FIG. 13, the plurality of adsorbing regions is located around holes 267 in which lift-up pins for pushing the circumferential portion of the substrate 230 are inserted.

In the more specific example shown in FIG. 13, the three adsorbing regions of the adsorbing regions equally divided into eight in the circumferential direction between the first wall portion 261 and the second wall portion 262 are located around the three holes 267.

As shown in FIG. 14, the circumferential support portion 266 of the present embodiment is stepwise lowered in height in order of the third wall portion 263, the second wall portion 262 and the first wall portion 261 from the center side so that the bonding surface of the substrate 230 is deformed upward in FIG. 14 in a convex shape toward the substrate 210. Specifically, a height of the second wall portion 262 is lower than a height of the third wall portion 263, a height of the first wall portion 261 is lower than the height of the second wall portion 262, and a difference between the height of the third wall portion 263 and the height of the second wall portion 262 is equal to or less than a difference between the height of the second wall portion 262 and the height of the first wall portion 261.

In addition, heights of the plurality of support pins 265 located between the third wall portion 263 and the second wall portion 262 become stepwise lower toward the outer peripheral side so that the bonding surface of the substrate 230 is deformed in a convex shape toward the substrate 210. Further, as shown in FIG. 14, the height of the first wall portion 261 is such a degree that the substrate 230 does not come into contact with the first wall portion even when the substrate 230 is attracted with a relatively high negative pressure in the adsorbing region between the second wall portion 262 and the first wall portion 261, and is also formed low so that attracting by a negative pressure is possible. Note that, as described above, since the support pins 265 are not present in the region, the substrate 230 does not come into contact with the support pins 265.

Furthermore, in FIG. 14, curved states of the substrate 230 before and after the substrate is subjected to UP with the above-described relatively high negative pressure in the adsorbing region are shown, the curved state of the substrate 230 after being subjected to UP with the negative pressure is drawn with a dashed line, the bonding surface of the substrate 230 in the BW end position 214 becomes lower, as compared to before being subjected to UP with the negative pressure, and a state where the interval between the substrate 210 and the substrate 230 is being widened is shown with an outlined arrow.

In a region where voids are likely to occur in each substrate, for example, the surroundings of the holes 267 in which the lift-up pins are inserted and regions that face the places where the notches 211 and 231 are formed, which have been described with reference to FIGS. 11 and 12, the substrate bonding apparatus 100 of the present embodiment may be configured to attract the substrate 230 with a relatively higher negative pressure and to curve the substrate 230 with a relatively greater curvature than the other regions by using the substrate holder 260 having a plurality of adsorbing regions.

When the substrate 230 is largely curved as a whole, a deviation amount on the bonding surface may increase. However, by using the substrate holder 260, it is possible to curve only a region, in which voids are likely to occur, with a relatively great curvature, and to make bonding deviation as small as possible while suppressing occurrence of voids.

Note that, in a case where the substrate holder 240 that does not have a plurality of adsorbing regions is used, by arranging the holes 267 in which the lift-up pins are inserted on the center sides of the substrates 210 and 230, wherein the center sides of the substrates 210 and 230 can maintain, which is shown in FIG. 7A, the state where the free upper substrate 210 that is not retained by the substrate holder is largely bent, the effects similar to the above can be obtained.

The substrate 230 may be non-uniformly curved in a plane or may be uniformly curved in the entire plane.

In addition, a curved amount (curved degree) may be specific to each substrate 230 or may be specific to a group of the plurality of substrates 230, for example, a rod on which the plurality of substrates 230 is stacked for storage, a group that has passed through the same manufacturing process, a group having the same crystal orientation, or the like.

In a case where the curved degree is specific to each substrate 230, the curved degree is measured before and after being imported into the substrate bonding apparatus 100, for example, and an adsorption force of the substrate holder 260 configured to retain the substrate 230 is adjusted in a plane according to a measurement result.

For example, in a case where the circumferential portion of the substrate 230 is curved in a concave shape in a direction away from the substrate holder 260, the adsorption force may be made stronger so that the curved amount is approximately the same as other regions in the plane.

In a case where the curved degree is specific to each group of the plurality of substrates 230, the adsorption force measured and adjusted for the first one substrate may also be applied to other substrates in the same group.

For example, information indicative of places where voids are likely to occur for each group may be acquired in advance, and the bending amount in the circumferential direction may be set different uniformly for the same type of a substrate group, a substrate group having the same crystal orientation or a substrate group that has passed through the same manufacturing process.

Note that, in any case, the plurality of substrate holders 240 where the heights of the wall portions 241 are each different may be prepared, and the substrate bonding apparatus 100 may select and use the substrate holder 240 having the height of the wall portion 241 corresponding to the curved degree of the substrate 230, for bonding of the substrates 210 and 230.

In addition, in any case, the height of the wall portion 241 of the substrate holder 240 described with reference to FIG. 8 may be formed lower than the other regions, in a region where the relatively more adiabatic expansion voids occur, for example, surroundings of the holes 247 in which the lift-up pins are inserted and places that face the notches 211 and 231 of the substrates 210 and 230.

Figure 15:
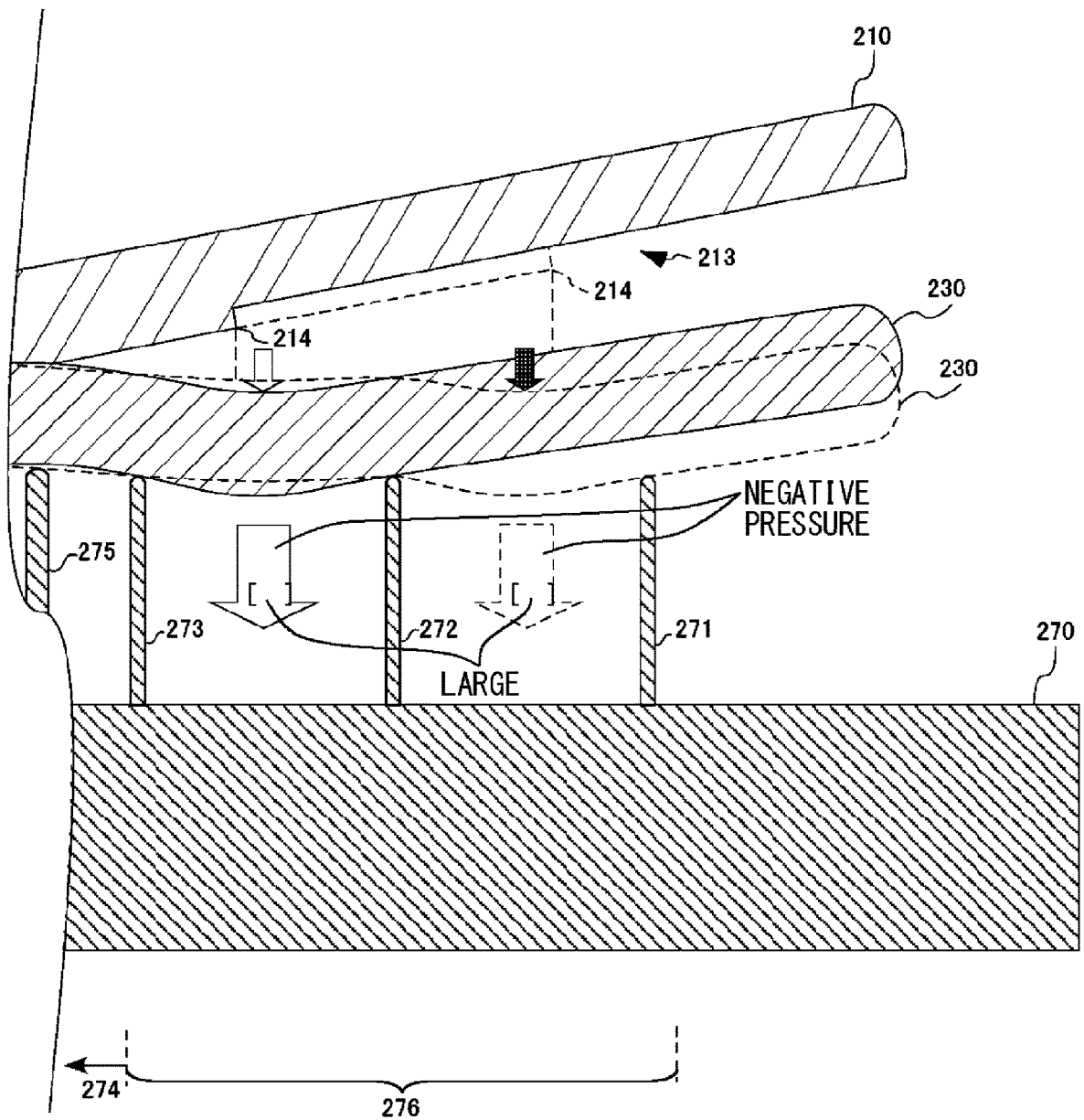
FIG. 15 is a schematic partially enlarged cross-sectional view for illustrating substrate interval adjustment of the BW end position 214 of the substrates 210 and 230 in the bonding process using a substrate holder 270.

FIG. 15 is a schematic partially enlarged cross-sectional view for illustrating substrate interval adjustment of the BW end position 214 of the substrates 210 and 230 in the bonding process using a substrate holder 270.
The partially enlarged view is a partially enlarged view of a cross section of the substrate holder 270 at the same place as a line II-II of FIG. 13.

As a difference of the substrate holder 270 of the present embodiment from the substrate holder 260 described with reference to FIGS. 13 and 14, heights of a first wall portion 271, a second wall portion 272 and a third wall portion 273 in at least a partial region of an circumferential support portion 276 are uniform, as shown in FIG. 15, and a support pin 275 is not arranged in any of an adsorbing region between the first wall portion 271 and the second wall portion 272 and an adsorbing region between the second wall portion 272 and the third wall portion 273 in the region. The substrate holder 270 of the present embodiment is configured to support the circumferential portion of the substrate 230 so that at least a partial region of the circumferential portion of the substrate 230 is curved toward the substrate holder 240 with a curvature greater than that of the central portion of the substrate 230 by attracting the substrate 230 with a relatively high negative pressure in any one of the adsorbing region between the first wall portion 271 and the second wall portion 272 and the adsorbing region between the second wall portion 272 and the third wall portion 273. Note that, a central support portion 274 of the substrate holder 270 has a plurality of support pins 275, like the substrate holder 240 and the like.

In FIG. 15, a case where the substrate 210 has a step portion 213 whose trimming width is wide is drawn with a solid line, as a first example, and a case where the substrate 210 has a step portion 213 whose width is narrow is drawn with a dashed line, as a second example.

Further, in FIG. 15, a curved state of the substrate 230 when an adsorbing region for attracting the substrate 230 with the above described relatively high negative pressure is made to correspond to the BW end position 214 based on the wide step portion 213 of the first example and is set to the adsorbing region between the second wall portion 272 and the third wall portion 273 is shown with a solid line, and a curved state of the substrate 230 when the adsorbing region is made to correspond to the BW end position 214 based on the narrow step portion 213 of the second example and is set to the adsorbing region between the first wall portion 271 and the second wall portion 272 is shown with a dashed line. Note that, in FIG. 15, a position of the adsorbing region for attracting the substrate 230 with the above-described relatively high negative pressure is shown with an outlined arrow in the first example and is shown with a meshed arrow in the second example.

Further, in FIG. 15, the bonding surface of the substrate 230 in the BW end position 214 in the first example is lower as compared with the bonding surface of the substrate 230 in the same position in the second example, and a state where the interval between the substrate 210 and the substrate 230 in the position is being widened is shown with an outlined arrow.
Similarly, in FIG. 15, the bonding surface of the substrate 230 in the BW end position 214 in the second example is lower as compared with the bonding surface of the substrate 230 in the same position in the first example, and a state where the interval between the substrate 210 and the substrate 230 in the position is being widened is shown with a meshed dashed arrow.

As described above, in a case where the circumferential edge of the bonding surface of at least one of the substrates 210 and 230 to be bonded is formed with the step portion 213, an end portion on the center side of the step portion 213 is a terminating end on the outer peripheral side of the flat bonding surface and becomes a position in which the BW ends, i.e., the BW end position 214.
In other words, the position of the BW end position 214 is different depending on presence or absence of the step portion 213 and the width of the step portion 213.
In addition, the adiabatic expansion voids are highly likely to occur on a side closer to a center than the BW end position 214 by about several millimeters.

The substrate bonding apparatus 100 of the present embodiment may be configured to make a negative pressure in an adsorbing region corresponding to the width of the step portion 213 of the substrate 210, i.e., located in the BW end position 214 higher than the negative pressure in other adsorbing regions and to curve one region of the substrate 230 facing the adsorbing region, i.e., one region located in the BW end position 214 with a relatively great curvature by using the substrate holder 270 having a plurality of adsorbing regions.
Thereby, the substrate bonding apparatus 100 can widen a space between the substrate 210 and the substrate 230 in a region adjacent to the center side of the BW end position 214, thereby reducing an occurrence risk of voids in the region.
Note that, a part of the stacked substrate 201 closer to a center than the BW end position 214 may be used as a product and a part on the further outer peripheral side than the BW end position 214 may not be used as a product, and according to the substrate bonding apparatus 100, it is possible to reduce an occurrence risk of voids in the part of the stacked substrate 201 that is used as a product, so that it is possible to improve the yield of the product.

Note that, in the case of the above-mentioned first example, the adsorbing region between the first wall portion 261 and the second wall portion 262 may attract the substrate 230 with a negative pressure lower than that of the adsorbing region between the second wall portion 262 and the third wall portion 263 or may not attract the substrate 230.
Note that, in any case of the above-mentioned first example and second example, the heights of the first wall portion 271, the second wall portion 272 and the third wall portion 273 in at least a partial region of the circumferential support portion 276 may be uniform, as shown in FIG. 15, or may not be uniform, unlike FIG. 15, for example, may be gradually lower outward in the radial direction.

Figure 16:
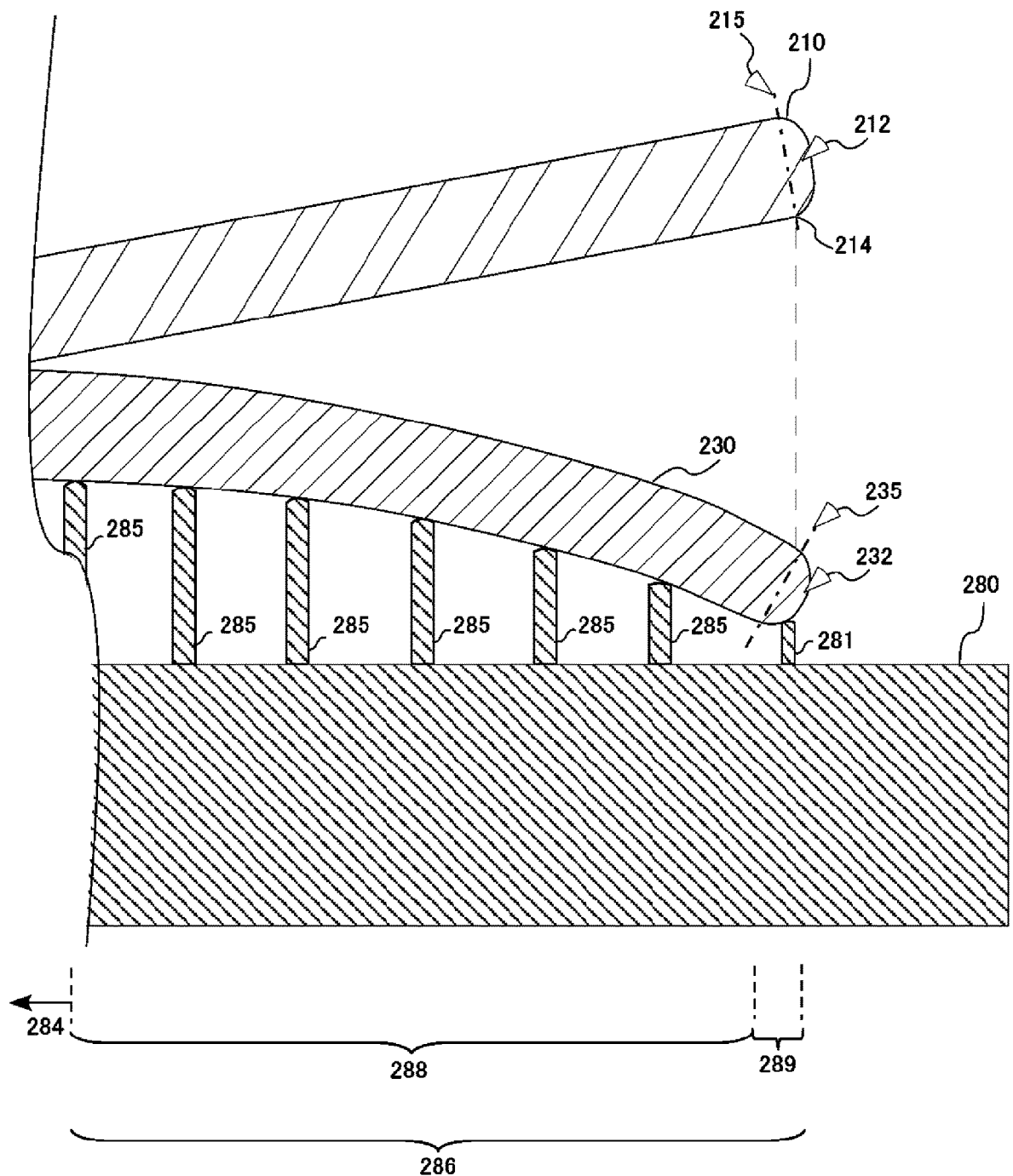
FIG. 16 is a schematic partially enlarged cross-sectional view of the BW end position 214 of the substrates 210 and 230 in the bonding process using a substrate holder 280.

FIG. 16 is a schematic partially enlarged cross-sectional view of the BW end position 214 of the substrates 210 and 230 in the bonding process using still another substrate holder 280.
In the present embodiment, the substrates 210 and 230 are not formed with the step portions.
As a difference of the substrate holder 280 from the substrate holder 240 described with reference to FIGS. 8 and 9, an circumferential support portion 286 is configured to additionally or alternatively support a terminating end on the outer peripheral side of a flat surface on the circumferential side of the substrate 230 in at least a partial region, i.e., a place adjacent to the outer peripheral side of the BW end position 214 of the substrate 230 in a case where the substrates 210 and 230 are not formed with the step portions. The BW end position 214 in the case where the substrates 210 and 230 are not formed with the step portions, like the present embodiment, is on perimeters 215 and 235 between bevels 212 and 232, which are end surfaces of the circumferential edges of the substrates 210 and 230, and other portions except the bevels 212 and 232 of the substrates 210 and 230.

As a specific example shown in FIG. 16, the circumferential support portion 286 of the substrate holder 280 has, in an outer region 289, an annular wall portion 281 whose edge on an inner circumference side comes into contact with the bevel 232 of the substrate 230 when the substrate 230 is placed, and has, in an inner region 288, a plurality of support pins 285 arranged up to the vicinity of the wall portion 281 so that heights become gradually lower from the center side toward the outer peripheral side so as for the bonding surface of the substrate 230 to be deformed upward in FIG. 16 in a convex shape toward the substrate 210.

Specifically, a difference between the lowest height arranged near the wall portion 281 and the highest height arranged on the center side of the heights of the plurality of support pins 285, which become gradually lower, is equal to or less than a difference between the highest height arranged on the center side and the height of the wall portion 281.

Note that, the central support portion 284 of the substrate holder 280 has a plurality of support pins 285, like the substrate holder 240 and the like.

As described above, the substrate 230 that is retained by the substrate holder 280 may be non-uniformly curved in a plane or may be uniformly curved in the entire plane. For example, the circumferential side of the substrate 230 may be warped in a concave shape toward a side of the bonding surface.

In a case where such substrate 230 is retained by a vacuum adsorption-type substrate holder where an annular wall portion is formed at the outermost periphery, and where the substrate 230 has a region that is located on an outermore periphery side than the wall portion and is not adsorbed and retained by the substrate holder, i.e., an overhang portion, the overhang portion of the substrate 230 flips up toward the substrate 210 to be bonded, due to the warping in the concave shape described above.

As a result, a space between the substrate 210 and the substrate 230 on the outer peripheral side is narrowed, so that an occurrence risk of voids increases.

In contrast, according to the substrate holder 280 of the present embodiment, the wall portion 281 in the outer region 289 of the circumferential support portion 286 supports the bevel 232 of the substrate 230, i.e., eliminates most of the overhang portion of the substrate 230, so that it is possible to prevent the flipping-up due to the warping in the concave shape described above.

Therefore, the substrate holder 280 can lower a risk that voids will occur on the outer peripheral side of the stacked substrate 201 where the substrates 210 and 230 are bonded.

Figure 17:
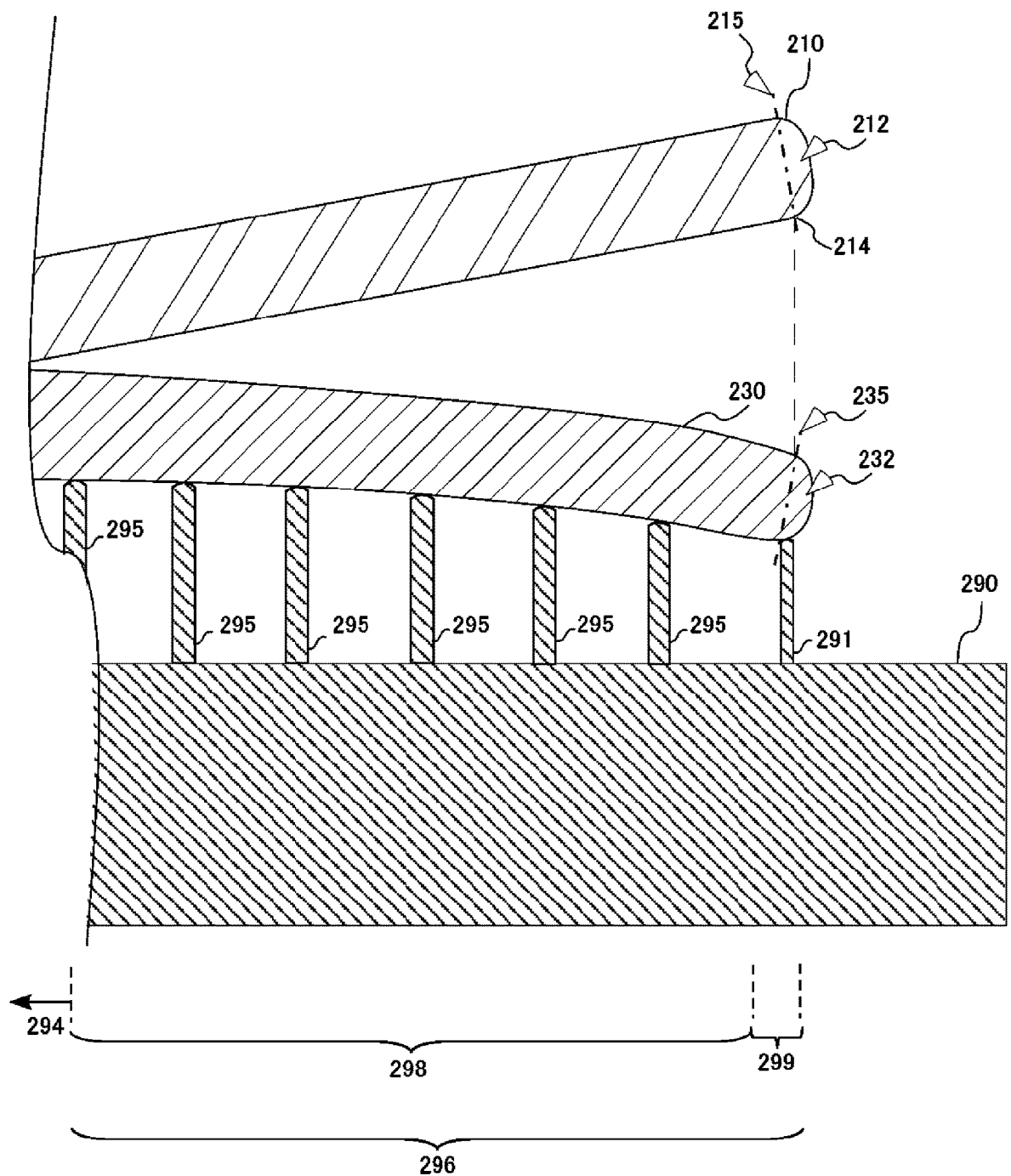
FIG. 17 is a schematic partially enlarged cross-sectional view of the BW end position 214 of the substrates 210 and 230 in the bonding process using a substrate holder 290 that is a modified embodiment of the substrate holder 280 shown in FIG. 16.

FIG. 17 is a schematic partially enlarged cross-sectional view of the BW end position 214 of the substrates 210 and 230 in the bonding process using a substrate holder 290 that is a modified embodiment of the substrate holder 280 shown in FIG. 16.

In the present embodiment, the substrates 210 and 230 are not formed with the step portions, like the embodiment of FIG. 16.

As a difference of the substrate holder 290 from the substrate holder 280 described with reference to FIG. 16, a magnitude of a curvature with which an circumferential support portion 296 of the substrate holder 290 curves the substrate 230 is less as compared with a magnitude of a curvature with which the circumferential support portion 286 of the substrate holder 280 of FIG. 16 curves the substrate 230.

More specifically, differences between heights of a plurality of support pins 295 included in a central support portion 294 of the substrate holder 290 and a height of a wall portion 291 in an outer region 299 of the circumferential support portion 296 are less than differences between the heights of the plurality of support pins 285 included in the central support portion 284 of the substrate holder 280 and the height of the wall portion 281 in the outer region 289 of the circumferential support portion 286 shown in FIG. 16.

In addition, a difference between the lowest height arranged near the wall portion 291 and the highest height arranged on the center side of the heights of the plurality of support pins 295 in the inner region 298 of the circumferential support portion 296 of the substrate holder 290 is less than a difference between the lowest height arranged near the wall portion 281 and the highest height arranged on the center side of the heights of the plurality of support pins 285 in the inner region 288 of the circumferential support portion 286 of the substrate holder 280 shown in FIG. 16.

Further, the circumferential support portion 296 of the substrate holder 290 is configured to additionally or alternatively support, in at least a partial region, a terminating end on the outer peripheral side of a flat surface on the circumferential side of the substrate 230, i.e., the BW end position 214 of the substrate 230 or a position closer to a center than the BW end position 214 and near the BW end position 214 in a case where the substrates 210 and 230 are not formed with the step portions.

In other words, the circumferential support portion 296 is configured to support, in at least a partial region, a perimeter 235 of the substrate 230 or a position closer to a center than the perimeter 235 and near the perimeter 235.

More specifically, the circumferential support portion 296 has, in the outer region 299, the annular wall portion 291 whose edge on an inner circumference side comes into contact with the perimeter 235 of the substrate 230 or the vicinity on the center side of the perimeter 235 when the substrate 230 is placed.

In this case, an inner diameter of the wall portion 291 of the substrate holder 290 may be smaller than an inner diameter of the wall portion 281 of the substrate holder 280.

According to the substrate holder 290 of the present embodiment, the wall portion 291 in the outer region 299 of the circumferential support portion 296 supports the perimeter 235 of the substrate 230 or the vicinity of the center side of the perimeter 235, i.e., eliminates most of the overhang portion of the substrate 230, so that the similar effects to the substrate holder 280 shown in FIG. 16 are obtained.

Like the substrate holder 280 shown in FIG. 16 or the substrate holder 290 shown in FIG. 17, within the range in which the effect of adsorbing and retaining the substrate 230 by the circumferential support portion 286 or the like is not lost, the above effects can be exhibited more effectively by enlarging the inner diameter of the wall portion 281 or the like of the circumferential support portion 286 or the like as large as possible.

In any of the above-described embodiments, the substrate bonding apparatus 100 may comprise a driving unit configured to deform the circumferential support portion of the substrate holder 240 or the like so that the substrate 230 is curved toward the substrate holder 240 or the like with a curvature greater than that of the central portion of the substrate 230 in at least a partial region of the circumferential portion of the substrate 230.

As used herein, the deformation of the circumferential support portion of the substrate holder 240 or the like may be deformation of the substrate holder 240 or the like itself or deformation, for example, variation in height of the wall portion 241 or the like or the plurality of support pins 245 or the like of the substrate holder 240 or the like. In this case, the wall portion 241 or the like or the plurality of support pins 245 or the like of the substrate holder 240 or the like may be a liftable mechanism.

One example of the above-mentioned driving unit may be a plurality of actuators arranged along a lower surface of the substrate holder 240 or the like on the lower stage 332, and the plurality of actuators may be configured to individually drive as a working fluid is supplied from a pressure source via a pump and a valve from an outside, under control of the control unit 150.

Thereby, the plurality of actuators may be configured to individually expand and contract in different amounts of expansion and contractions in a thickness direction of the lower stage 332, thereby moving up or down a plurality of regions of the substrate holder 240 or the like retained on the lower stage 332.

Before placing the substrate 230 on the lower stage 332 via the substrate holder 240 or the like or before starting bonding of the substrates 210 and 230 after the placement, the substrate bonding apparatus 100 may be configured to drive the driving unit to move the lower stage 332, as described above, so as to deform the circumferential support portion of the substrate holder 240 or the like.

The substrate bonding apparatus 100 may further comprise a detection unit configured to detect that the contact region of the substrate 230 and the substrate 210 has reached a predetermined position.

The above-mentioned driving unit may be configured to deform the circumferential support portion of the substrate holder 240 or the like, in response to the detection unit detecting that the contact region has reached the above-mentioned position.

The substrate bonding apparatus 100 may further comprise an acquisition unit configured to acquire information about at least any one of a width of trimming formed at the circumferential portion of the substrate 210; 230, an orientation of curve of the circumferential portion of the substrate 210; 230 that has occurred before being retained by the substrate holder 240 or the like, a magnitude of the curve, a position of a notch formed at the circumferential portion, and a manufacturing process and a material of the substrate 210; 230, for each of the substrates 210 and 230.

In addition, the above-mentioned driving unit may be configured to set different amounts of deformation in the circumferential support portion of the substrate holder 240 or the like, based on a command of the control unit 150, according to the information acquired by the acquisition unit.

The control unit 150 may be an example of the acquisition unit.

Note that, for each of the substrates 210 and 230, the substrate bonding apparatus 100 may be configured to measure and acquire the information such as the width of trimming, the orientation of curve of the circumferential portion, the magnitude of the curve, and the position of the notch formed at the circumferential portion by itself or may be configured to acquire the same from an outside.

In any of the above-described embodiments, the substrate bonding apparatus 100 may comprise a plurality of substrate holders 240 or the like.

In this case, at least one of a curvature of at least a partial region of the circumferential portion of the substrate 230 that is curved by the circumferential support portion 246, a width of the at least partial region and a position of the at least partial region may be different for each of the plurality of substrate holders 240 or the like For example, the plurality of substrate holders 240 or the like may be formed with regions in which the heights of the plurality of support pins 245 or the like of the plurality of substrate holders 240 or the like or curvatures of the virtual support surfaces formed by the plurality of support pins 245 or the like are different from other regions.

In addition, the substrate bonding apparatus 100 may comprise a selecting unit configured to select one substrate holder 240 or the like from the plurality of substrate holders 240 or the like, according to the above-mentioned information acquired by the above-mentioned acquisition unit.

For example, the above-mentioned various substrate holders 240 or the like as described above may be prepared, and the selecting unit may be configured to select a specific substrate holder 240 or the like, according to a position of the step portion 213.

Note that, the control unit 150 may be an example of the selecting unit.

Note that, the substrate bonding apparatus 100 may not comprise the selecting unit.

In this case, at the outside of the substrate bonding apparatus 100, one substrate holder 240 or the like may be selected from the plurality of substrate holders 240 or the like, according to the above-mentioned information, and information of the selected substrate holder 240 or the like may be provided to the substrate bonding apparatus 100 or the substrate holder 240 or the like itself may be imported.

In any of the above-described embodiments, the circumferential portion of the substrate 230 is curved with a relatively great curvature, so that a deviation may occur in the bonding surfaces of the substrates 210 and 230.

In addition, the support surface of the substrate holder 240 or the like may have a convex shape as a whole so as to correct a deviation due to distortion caused at the time of bonding the substrates 210 and 230.

As countermeasures for the above-mentioned deviation that may occur as a result of the circumferential portion of the substrate 230 being curved with a relatively great curvature, the substrate bonding apparatus 100 may be configured to acquire in advance a prediction value of a deviation amount by a method of, for example, acquiring a measurement value of a deviation that has occurred in past bonding of the same type of a substrate as the substrate 230 to be bonded, and to select the substrate holder 240 or the like having a support surface with a curvature that can correct the deviation amount, from the plurality of substrate holders 240 or the like whose curvatures of the entire convex shapes of the support surfaces are different from each other, based on the prediction value of the deviation amount.

In addition, similar to the above, the substrate bonding apparatus 100 may not select the substrate holder 240 or the like, and the substrate holder 240 or the like may be selected at the outside and the information of the selected substrate holder 240 or the like may be provided or the substrate holder 240 or the like itself may be imported.

Further, as countermeasures for the above-mentioned deviation that may occur as a result of the circumferential portion of the substrate 230 being curved with a relatively great curvature, the substrate bonding apparatus 100 may be configured to acquire in advance a prediction value of a deviation amount, as described above, and to drive the above-mentioned driving unit to deform the substrate holder 240 or the like so that the support surface of the substrate holder 240 or the like becomes a curvature that can correct the deviation amount, based on the prediction value of the deviation amount.

Further, as countermeasures for the above-mentioned deviation that may occur as a result of the circumferential portion of the substrate 230 being curved with a relatively great curvature, the substrate bonding apparatus 100 may be configured to acquire in advance a prediction value of a deviation amount, as described above, and to correct a pattern position based on the prediction value of the deviation amount when forming a pattern of a circuit region in the substrates 210 and 230 by exposure.

In this case, the pattern position may be adjusted so that the pattern of the circuit region of the substrate 230, for example, is closer to the center side by an amount corresponding to such a degree that the circumferential portion can be bent by the substrate holder 240 or the like.

The amount corresponding to such a degree that the circumferential portion can be bent by the substrate holder 240 or the like indicates an amount of positional deviation of the pattern of the circuit region of the substrate 230 that occurs as the substrate 230 is extended when the circumferential portion is bent by the substrate holder 240 or the like.

In any of the above-described embodiments, the circumferential support portion 246 of the substrate holder 240 or the like may include the plurality of support pins 245 or the like whose density increases, particularly, in the above-mentioned outer region.

When the density of the plurality of support pins 245 or the like is low in the outer region, the substrate 230 retained by the substrate holder 240 or the like become concave in the region where the density is low and the circumferential side of the substrate 230 flips up toward the bonding surface by recoil thereof.

According to the substrate holder 240 of the like including the above-mentioned configuration, it is possible to prevent the flipping-up due to the recoil, thereby lowering the occurrence risk of voids on the outer peripheral side.

In any of the above-described embodiments, for example, a circumferential portion of a wiring layer stacked on a surface of the substrate 230 that is bonded by the substrate bonding apparatus 100 may be thinner than a central portion as a result of CMP (Chemical Mechanical Polishing) after film formation of the wiring layer each time, so that a thickness of the substrate 230 itself may become thinner from the central portion toward the circumferential portion. The change in thickness of the substrate 230 may be described as outer circumference sagging of the substrate 230, and a difference between the thickness of the central portion and the thickness of the circumferential portion of the substrate 230 may be referred to as a sagging amount.

When bonding the substrate 230 having a large outer circumference sagging amount, the substrate bonding apparatus 100 may select and use the substrate holder 240 or the like whose height of the wall portion 241 is high so that the bending amount at the circumferential portion becomes small or may perform adjustment by an actuator so that the height of the wall portion 241 of the substrate holder 240 become high, for example. Thereby, the substrate bonding apparatus 100 can avoid bending the circumferential portion of the substrate 230 beyond a bending amount necessary to suppress occurrence of voids, and therefore, can suppress the above-mentioned deviation that may be caused due to the large bending of the circumferential portion of the substrate 230.

Note that, the substrate bonding apparatus 100 may measure and acquire information about the outer circumference sagging amount of the substrate 230 by itself or may acquire the same from an outside.

In a case where the substrate 230 that is bonded by the substrate bonding apparatus 100 has outer circumference sagging, the interval between the substrate 210 and the substrate 230 becomes wide on the outer peripheral side between the substrates 210 and 230.

As a result, it is possible to reduce the advancing speed of the BW on the outer peripheral side between the substrates 210 and 230, i.e., a movement speed of a fluid between the substrates 210 and 230, and/or it is possible to easily release the fluid between the substrates 210 and 230 to the outside of the substrates 210 and 230.

Thereby, it is possible to reduce a chance that voids will occur on the outer peripheral side between the bonded substrates 210 and 230.

In order to exhibit the similar effects, in any of the above-described embodiments, additionally or alternatively, the substrates 210 and 230 that are bonded by the substrate bonding apparatus 100 may be subjected to specific processing or process.

Figure 18:
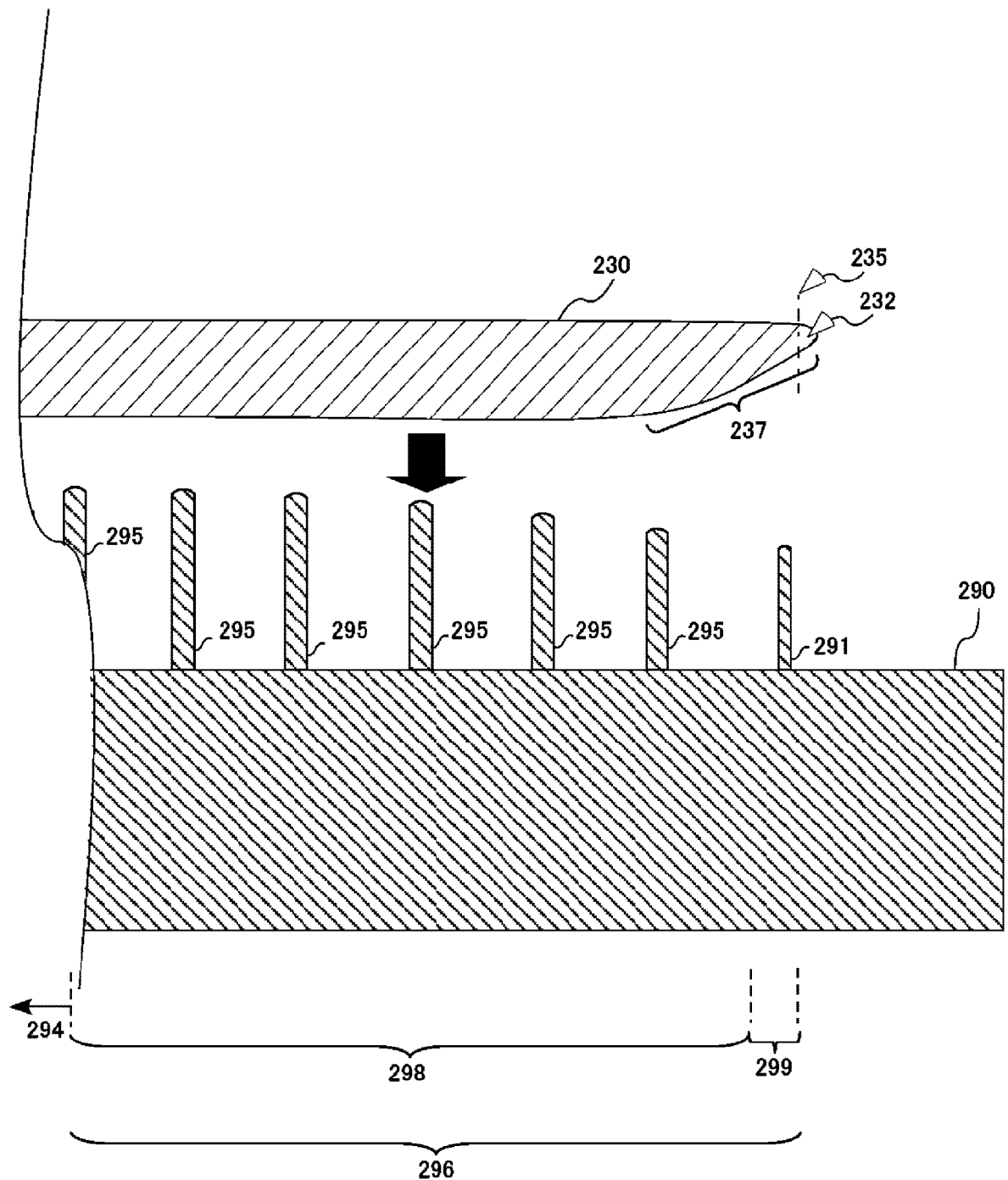
FIG. 18 is a partially enlarged view showing a process of placing the substrate 230 including a tapered portion 237 on the substrate holder 290 shown in FIG. 17.
Figure 19:
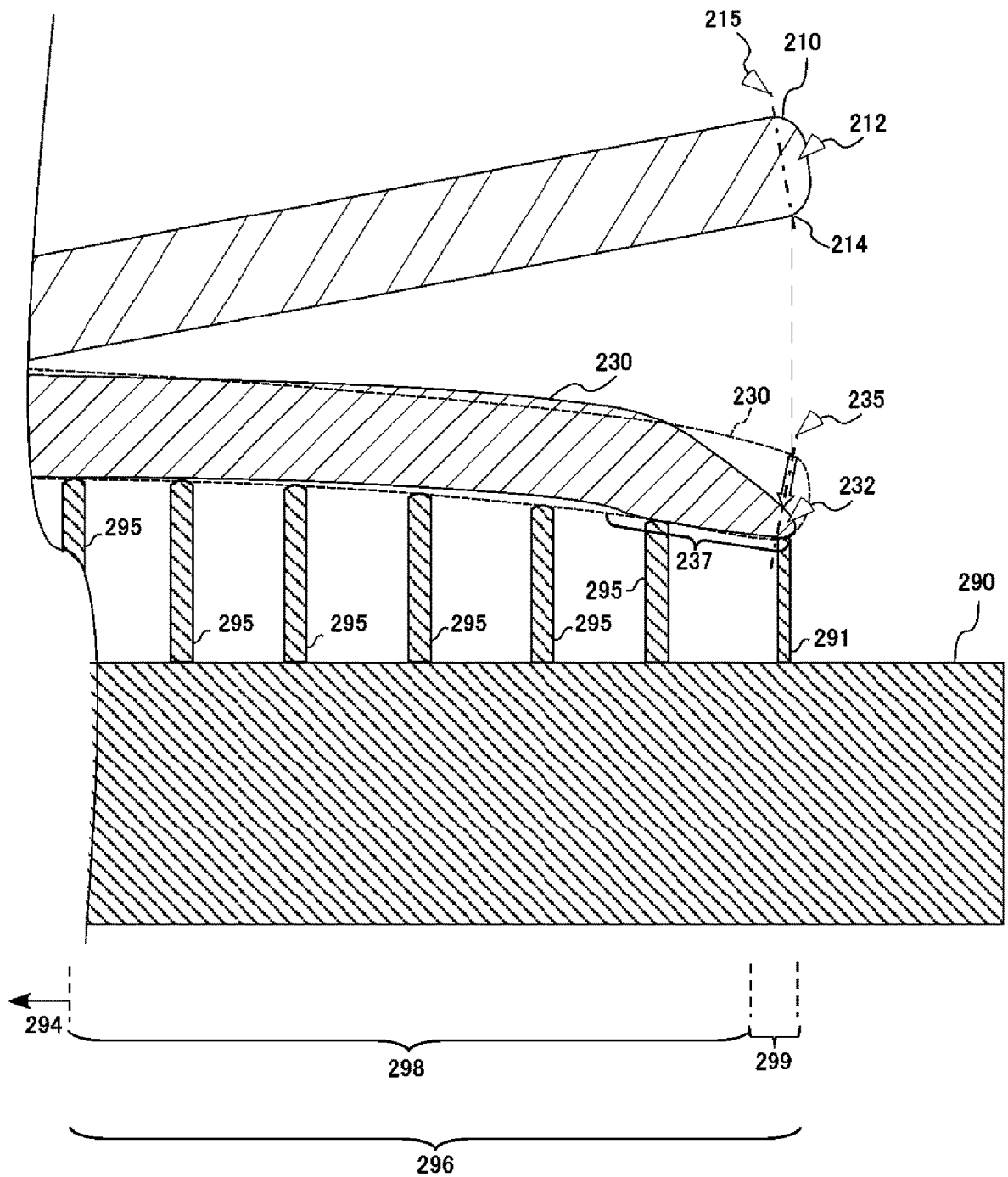
FIG. 19 is a schematic partially enlarged cross-sectional view of the BW end position 214 of the substrates 210 and 230 in the bonding process using the substrate 230 and the substrate holder 290 shown in FIG. 18.

FIGS. 18 and 19 show, as one example of the above-mentioned specific processing, a case where the substrate 230 includes a tapered portion 237.

FIG. 18 is a partially enlarged view showing a process of placing the substrate 230 including a tapered portion 237 on the substrate holder 290 shown in FIG. 17.

In FIG. 18, a direction in which the substrate 230 is placed on the substrate holder 290 is shown with a black arrow.

Note that, in descriptions of FIG. 18 and thereafter, the configurations corresponding to the configurations described in the plurality of embodiments shown in FIGS. 1 to 17 are denoted with the same reference signs, and the overlapping descriptions are omitted.

The substrate 230 of the present embodiment is formed with a tapered portion 237 inclined with respect to a lower surface and a side surface of the substrate 230 at a circumferential portion of the lower surface facing the substrate holder 240.

Therefore, a thickness of the circumferential portion of the substrate 230 is smaller than a thickness of the central portion in the radial direction.

The tapered portion 237 is continuously formed along an outer circumference of the substrate 230.

Instead of this, the tapered portion 237 may also be intermittently formed along the outer circumference of the substrate 230.

That is, the substrate 230 may partially include one or more tapered portions 237 at the circumferential portion continuing in the circumferential direction.

The substrate 230 may include the tapered portion 237 at at least a place of the circumferential portion where voids are likely to occur.

An angle of inclination of the tapered portion 237 relative to the lower surface of the substrate 230 may be constant in the circumferential direction of the substrate 230. Instead of this, for example, at the circumferential portion continuing in the circumferential direction of the substrate 230, the tapered portion 237 at a place where voids are likely to occur may have a relatively large angle of inclination, as compared to the tapered portion 237 at other places.

Note that, in the shown example, the tapered portion 237 is a curved surface. Instead of this, the tapered portion 237 may be a plane, a combination of a curved surface and a plane or a plurality of steps formed by respective end portions of the plurality of wiring layers described above.

FIG. 19 is a schematic partially enlarged cross-sectional view of the BW end position 214 of the substrates 210 and 230 in the bonding process using the substrate 230 and the substrate holder 290 shown in FIG. 18.

In FIG. 19, the substrate 230 that is retained by the substrate holder 290 according to the present embodiment is shown with a solid line, and the substrate 230 shown in FIG. 17 that is retained by the substrate holder 290 is shown with a dashed line.

In the present embodiment, the substrate 210 is not formed with the step portion, like the embodiment of FIG. 17.

In addition, as shown in FIG. 18, the bonding surface of the substrate 230 in a state where the substrate is not curved is a flat surface at portions except the bevel 212.

Therefore, the BW end position 214 is on the perimeters 215 and 235 of the bevels 212 and 232 of the substrates 210 and 230 and the other portions of the substrates 210 and 230 except the bevels 212 and 232.

Similar to the embodiment shown in FIG. 17, the circumferential support portion 296 of the substrate holder 290 is configured to additionally or alternatively support, in at least a partial region, the BW end position 214 of the substrate 230 or a position closer to a center than the BW end position 214 and near the BW end position 214.

That is, in the present embodiment, when the substrate 230 is adsorbed and retained on the substrate holder 290, the substrate 230 is forcibly bent so that the circumferential portion of the substrate 230 is convex toward the substrate 210.

Thereby, in the present embodiment, when bonding the substrates 210 and 230 by using the substrate holder 290, the bonding surface of the substrate 230 in the BW end position 214 becomes considerably lower and the interval between the substrate 210 and the substrate 230 become wider on the outer peripheral side between the substrates 210 and 230, as compared to the embodiment shown in FIG. 17, as shown with an outlined arrow in FIG. 19.

Figure 20:
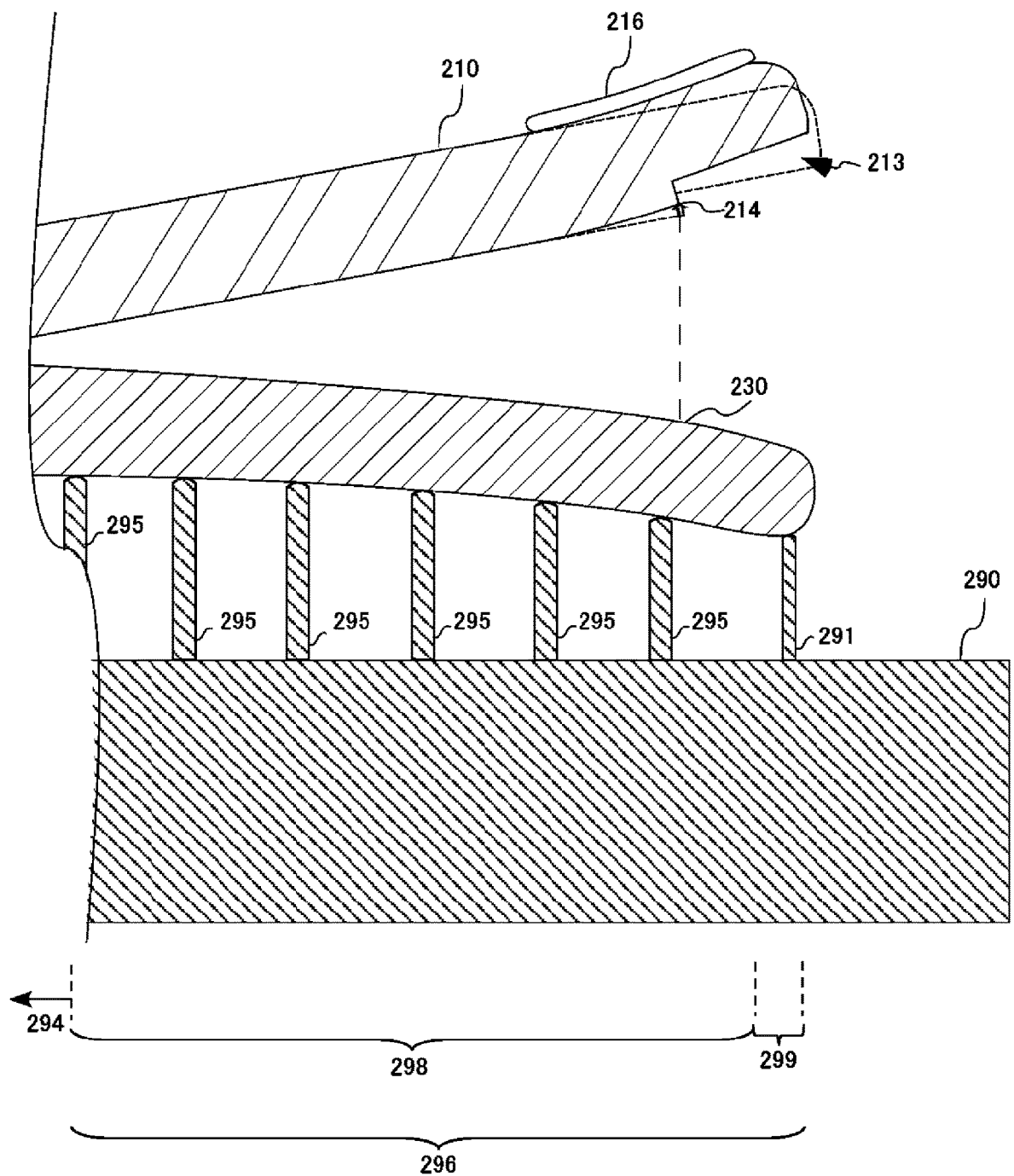
FIG. 20 is a schematic partially enlarged cross-sectional view of the BW end position 214 of the substrates 210 and 230 in the bonding process using the substrate holder 290 shown in FIG. 17 in a case where the substrate 210 includes a step portion 213 and a convex warping film 216.

FIG. 20 shows, as one example of the above-mentioned specific processing, a case where the substrate 210 includes a convex warping film 216.

FIG. 20 is a schematic partially enlarged cross-sectional view of the BW end position 214 of the substrates 210 and 230 in the bonding process using the substrate holder 290 shown in FIG. 17 in a case where the substrate 210 includes a step portion 213 and a convex warping film 216.

In FIG. 20, the substrate 210 that is bonded by the substrate holder 290 according to the present embodiment is drawn with a solid line, and the substrate 210 shown in FIG. 17 that is bonded by the substrate holder 290 is drawn with a dashed line.

The substrate 210 of the present embodiment is formed with a convex warping film 216 at the circumferential portion of the upper surface facing the substrate holder 220, and the bonding surface at the place where the convex warping film 216 is formed is curved in a convex shape toward the facing substrate 230.

The convex warping film 216 may be, for example, a thin film made of a shape-memory alloy or may be a resin film that shrinks by curing.

The convex warping film 216 is continuously formed along an outer circumference on the upper surface of the substrate 210.

Instead of this, the convex warping film 216 may also be intermittently formed along the outer circumference on the upper surface of the substrate 210.

That is, the substrate 210 may be partially formed on the upper surface with one or more convex warping films 216 at the circumferential portion continuing in the circumferential direction.

The substrate 210 may include the convex warping film 216 at at least a place of the circumferential portion where voids are likely to occur.

A thickness of the convex warping film 216 may be constant in the circumferential direction of the substrate 210. Instead of this, for example, at the circumferential portion continuing in the circumferential direction of the substrate 210, the convex warping film 216 at a place where voids are likely to occur may have a relatively larger thickness, as compared to the convex warping film 216 at other places, whereby the substrate 210 may be curved relatively largely.

In the present embodiment, since the substrate 210 including the step portion 213 is formed on the upper surface with the convex warping film 216, when bonding the substrates 210 and 230 by using the substrate holder 290, the bonding surface of the substrate 210 in the BW end position 214 becomes higher than the embodiment shown in FIG. 17, as shown with an outlined arrow in FIG. 20.

Thereby, the interval between the substrate 210 and the substrate 230 becomes wide on the outer peripheral side between the substrates 210 and 230.

Note that, in a case where an overhang portion that is not retained by the substrate holder is present at the circumferential edge of the substrate 230, for example, in a case where the substrate 230 is retained by the substrate holder 240 shown in FIG. 9, the substrate 230 may also additionally or alternatively include the convex warping film 216. That is, the substrate 230 may be formed with a convex warping film 216 at the circumferential portion of the lower surface facing the substrate holder 240 and the bonding surface at the place where the convex warping film 216 is formed may be curved in a convex shape.

Also with this configuration, the effects similar to the above are exhibited.

Figure 21:
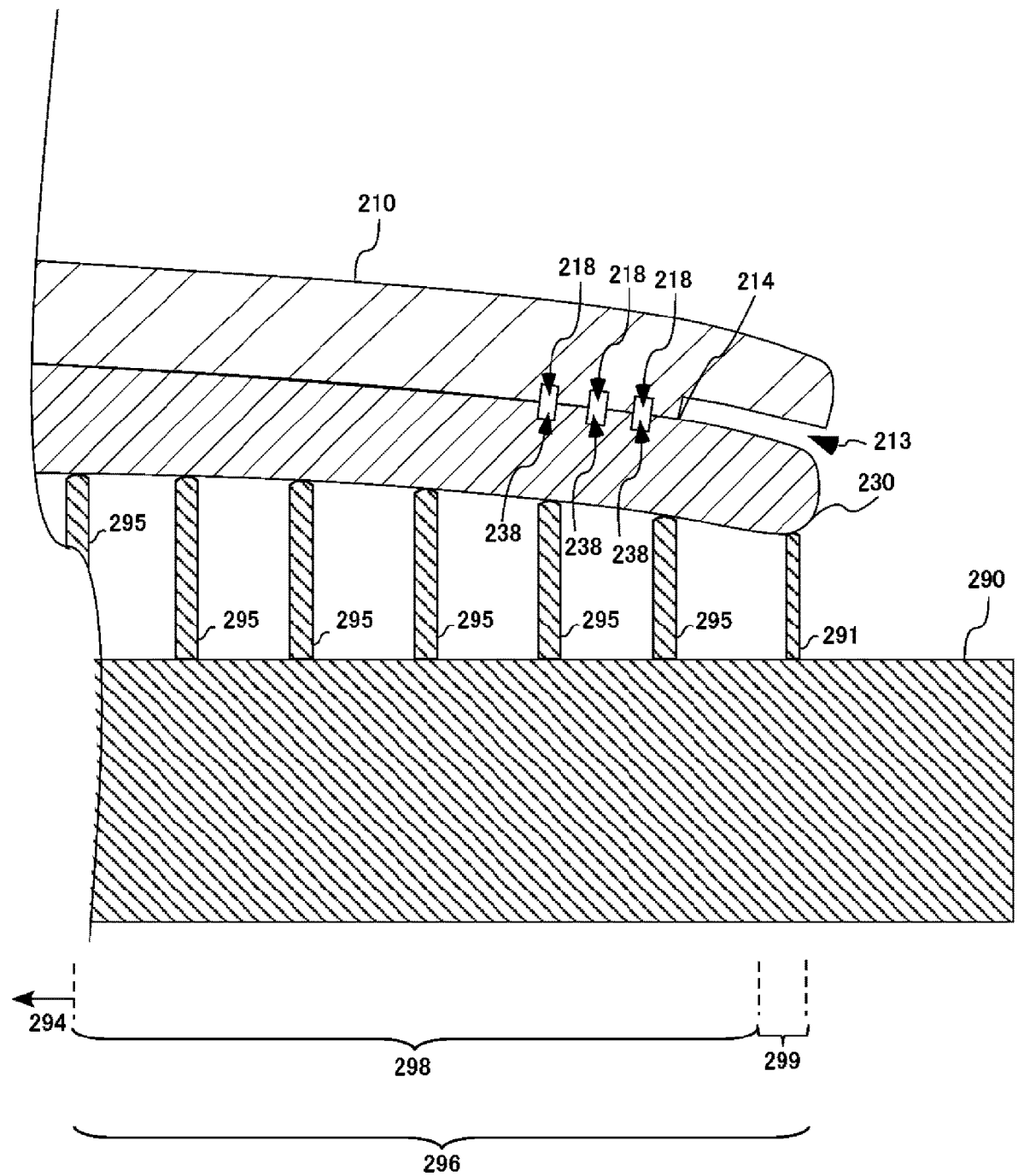
FIG. 21 is a schematic partially enlarged cross-sectional view of the BW end position 214 of the substrates 210 and 230 in the bonding process using the substrate holder 290 shown in FIG. 17 in a case where the substrate 210 includes the step portion 213 and the substrates 210 and 230 include void inflow grooves 218 and 238, respectively.

FIG. 21 shows, as one example of the above-mentioned specific processing, a case where the substrate 210 and 230 include void inflow grooves 218 and 238, respectively.

FIG. 21 is a schematic partially enlarged cross-sectional view of the BW end position 214 of the substrates 210 and 230 in the bonding process using the substrate holder 290 shown in FIG. 17 in a case where the substrate 210 includes the step portion 213 and the substrates 210 and 230 include void inflow grooves 218 and 238, respectively.

The substrates 210 and 230 of the present embodiment are respectively formed with the void inflow grooves 218 and 238 at the circumferential portions of the bonding surfaces. The plurality of void inflow grooves 218 and 238 is formed to face each other in positions closer to a center than the BW end position 214 and near the BW end position 214 at the circumferential portions of the bonding surfaces of the substrates 210 and 230.

Therefore, the bonding surfaces of the substrates 210 and 230 located between the plurality of void inflow grooves 218 and 238 are discretely joined to each other.

The void inflow grooves 218 and 238 are continuously formed along the outer circumferences of the substrates 210 and 230.

Instead of this, the void inflow grooves 218 and 238 may also be intermittently formed along the outer circumferences of the substrates 210 and 230.

That is, the substrates 210 and 230 may partially include one or more void inflow grooves 218 and 238, at the circumferential portions continuing in the circumferential directions. The substrates 210 and 230 may include the void inflow grooves 218 and 238 at at least places of the circumferential portions where voids are likely to occur.

Widths and depths of the void inflow grooves 218 and 238 may be constant in the circumferential directions of the substrates 210 and 230.

Instead of this, for example, at the circumferential portions continuing in the circumferential directions of the substrates 210 and 230, the void inflow grooves 218 and 238 at places where voids are likely to occur may have relatively large widths and depths, as compared to the void inflow grooves 218 and 238 at other places.

Further, additionally or alternatively, the void inflow grooves 218 and 238 at places where voids are likely to occur may be formed relatively more in the radial directions of the substrates 210 and 230.

Note that, in the shown example, the void inflow grooves 218 and 238 have quadrilateral profiles in cross sections in the radial directions of the substrates 210 and 230.

Instead of this, the profiles of the void inflow grooves 218 and 238 may also be arcs or free curves or may be a combination of a straight line and a curve.

In the present embodiment, when bonding the substrates 210 and 230 by using the substrate holder 290, as compared to the embodiment shown in FIG. 17, voids that occur on the outer peripheral side between the substrates 210 and 230 flow into the void inflow grooves 218 and 238 during an anneal, for example, i.e., are discharged into the void inflow grooves 218 and 238 from a space between the bonding surfaces, so that a chance for the voids to remain between the bonding surfaces can be reduced.

As a result, it is possible to reduce a chance that voids will occur on the outer peripheral side between the bonded substrates 210 and 230.

Note that, in the embodiment shown in FIG. 21, the configuration where both the substrate 210 and the substrate 230 include the void inflow grooves 218 and 238 has been described.

Instead of this, any one of the substrate 210 and the substrate 230 may include the void inflow grooves 218; 238.

Also with this configuration, the effects similar to the above are exhibited.

Figure 22:
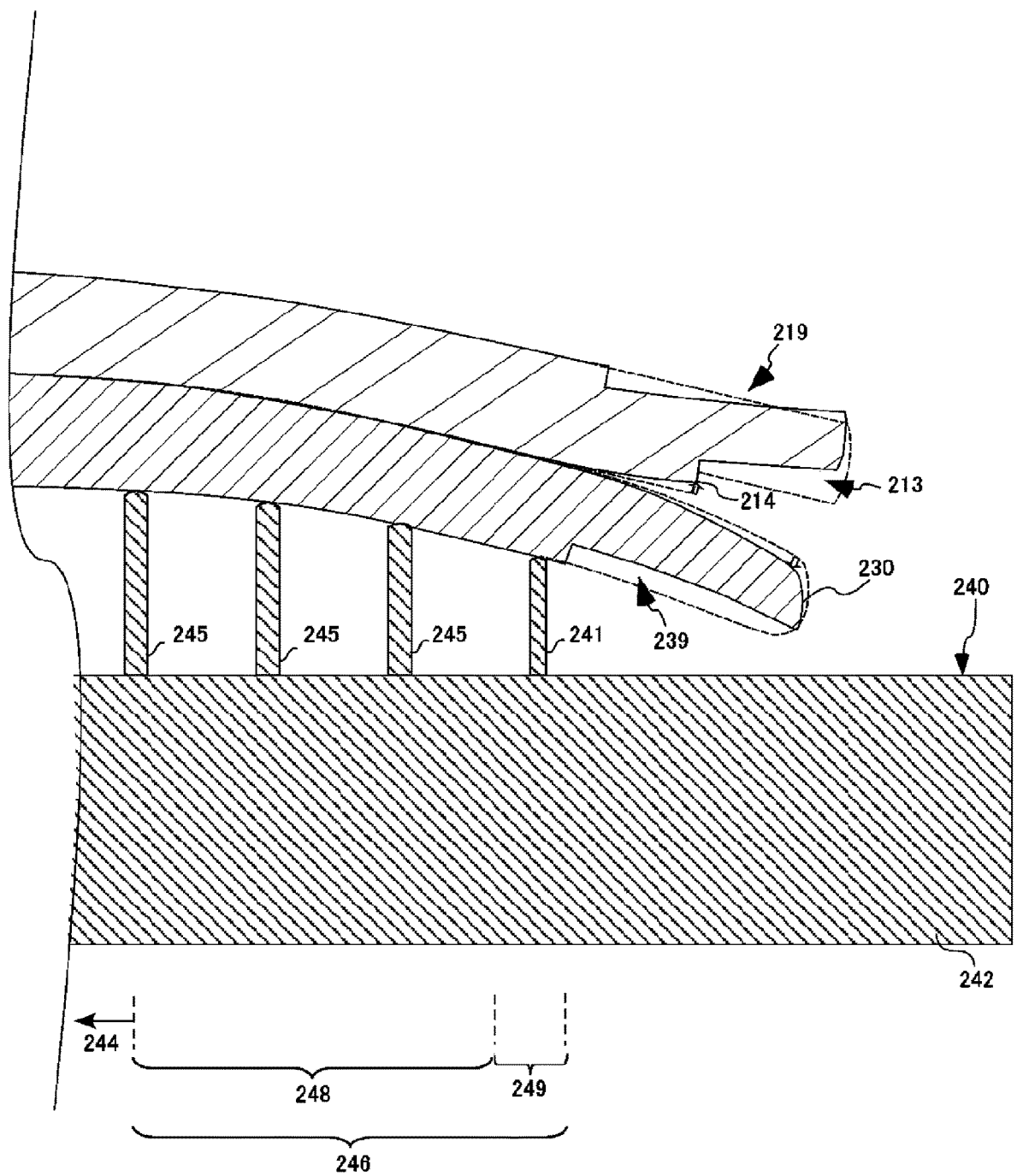
FIG. 22 is a schematic partially enlarged cross-sectional view of the BW end position 214 of the substrates 210 and 230 in the bonding process using the substrate holder 240 shown in FIG. 9 in a case where the substrate 210 includes the step portion 213 and the substrates 210 and 230 include back surface step portion 219 and 239, respectively.

FIG. 22 shows, as one example of the above-mentioned specific processing, a case where the substrate 210 and 230 include back surface step portions 219 and 239, respectively. FIG. 22 is a schematic partially enlarged cross-sectional view of the BW end position 214 of the substrates 210 and 230 in the bonding process using the substrate holder 240 shown in FIG. 9 in a case where the substrate 210 includes the step portion 213 and the substrates 210 and 230 include back surface step portions 219 and 239, respectively.

In the present embodiment, the substrate 210 has not only the step portion 213 formed at the circumferential portion of the bonding surface but also the back surface step portion 219 formed at the circumferential portion of the upper surface facing the substrate holder 220.

Therefore, a thickness of the substrate 210 is smaller at a place where the back surface step portion 219 is formed than a thickness at the central portion in the radial direction, and is further smaller at a place where both the back surface step portion 219 and the step portion 213 are formed.

In addition, the substrate 230 is not formed with a step portion on the bonding surface but is formed with the back surface step portion 239 at the circumferential portion of the lower surface facing the substrate holder 240.

Therefore, the thickness of the substrate 230 is smaller at a place where the back surface step portion 239 is formed than the thickness of the central portion in the radial direction.

The back surface step portions 219 and 239 are each continuously formed along the outer circumferences of the substrates 210 and 230.

Instead of this, the back surface step portions 219 and 239 may also be intermittently formed along the outer circumferences of the substrates 210 and 230.

That is, the substrates 210 and 230 may partially include one or more back surface step portions 219 and 239 at the circumferential portions continuing in the circumferential directions.

The substrates 210 and 230 may include the back surface step portions 219 and 239 at at least places of the circumferential portions where voids are likely to occur.

As for the back surface step portions 219 and 239, depths in the thickness direction and lengths in the radial direction of each substrate may be constant in the circumferential directions of the substrates 210 and 230.

Instead of this, for example, at the circumferential portions continuing in the circumferential direction of the substrate 210 and 230, the depths and lengths of the back surface step portions 219 and 239 at places where voids are likely to occur may relatively larger, as compared to the back surface step portions 219 and 239 at other places, whereby stiffness of the substrates 210 and 230 may be partially low.

Note that, in the shown example, the back surface step portions 219 and 239 are steps of one step.

Instead of this, the back surface step portions 219 and 239 may be steps of multiple steps, curved surfaces, tapered surfaces, a combination of a curved surface and a plane or a plurality of steps formed by the respective end portions of the plurality of wiring layers described above.

In the present embodiment, when bonding the substrates 210 and 230 by using the substrate holder 240, the substrates 210 and 230 including the back surface step portions 219 and 239 are curved to separate from each other at the overhang portion that is not retained at the circumferential edge of the substrate 230 by the substrate holder 240. This is because the stiffness of the substrates 210 and 230 is lowered at the places where the back surface step portions 219 and 239 are formed and the substrates 210 and 230 push each other and are thus widened by a pressure of air intervening between the substrates 210 and 230.

In FIG. 22, the substrates 210 and 230 that are bonded by the substrate holder 240 according to the present embodiment are drawn with a solid line, and the substrates 210 and 230 that are bonded by the substrate holder 240 according to the embodiment shown in FIG. 9 are drawn with a dashed line.

As the places where the back surface step portions 219 and 239 of the substrates 210 and 230 are formed are curved to separate from each other, the bonding surface of the substrate 210 in the BW end position 214 becomes higher and the bonding surface of the substrate 230 in the BW end position 214 becomes lower, as compared to the embodiment shown in FIG. 9, so that the interval between the substrate 210 and the substrate 230 is widened on the outer peripheral side between the substrates 210 and 230, as shown with an outlined arrow in FIG. 22.

Note that, preferably, the thickness of the place of the circumferential portion of the substrate 230 where the back surface step portion 239 is formed is thick enough to secure such stiffness that the substrate 230 is not pulled up by the bonding force between the substrates 210 and 230 under BW progression and is also thin enough to curve the substrate 230 by the above-described pressure of air.

The example of FIG. 22 is an example where the two substrates 210 and 230 are formed with the back surface step portions 219 and 239, respectively.

However, only one of the two substrates 210 and 230 may be formed with the back surface step portion.

As one example of the above-mentioned specific process, a process of performing plasma irradiation and hydrophilizing process on the bonding surface at the circumferential portion for at least one of the substrates 210 and 230 to be bonded and then spraying air may be performed.

Further, additionally or alternatively, a process of roughening a surface roughness may be performed on the bonding surface on the circumferential side of the circumferential portion of the at least one substrate.

Since the place where the processes have been performed is lowered in a degree of activity, the bonding force with the other substrate to be bonded is lowered.

Thereby, the BW advancing speed at the place can be reduced.

In this regard, the joining force of the place is preferably adjusted after end of the BW so that the final joining strength after anneal is not lowered.

In addition, as one example of the above-mentioned specific process, a process of attaching water on the bonding surface on the circumferential side of the circumferential portion for at least one of the substrates 210 and 230 to be bonded may be performed.

Thereby, at the place where the process has been performed, since the BW advances with sandwiching water by the substrates 210 and 230, the BW advancing speed can be reduced.

In the examples of FIGS. 18 to 22, the amount of change or rate of change in height positions of the ends of the plurality of support pins 245 at the circumferential support portion 296 may be the same as the amount of change and rate of change at the central support portion 244.

Alternatively, the height positions of the ends of the plurality of support pins 245 may be the same at the central support portion 244 and the circumferential support portion 296.

In any of the above-described embodiments, preferably, the substrate, which has a relatively centrally convex shape on the bonding surface-side in a cross section perpendicular to the bonding surface, of the substrates 210 and 230 that are bonded by the substrate bonding apparatus 100 is retained on the upper stage 322-side and is released toward the other substrate retained on the lower stage 332-side.

Thereby, the space between the substrates under BW progression can be favorably widened.

While the embodiments of the present invention have been described, the technical scope of the invention is not limited to the above described embodiments.

It is apparent to persons skilled in the art that various alterations and improvements can be added to the above-described embodiments.

It is also apparent from the scope of the claims that the embodiments added with such alterations or improvements can be included in the technical scope of the invention.

For example, in any of the above-described embodiments, the aspect where the substrate 210 retained on the upper stage 322-side is mainly released toward the substrate 230 retained on the lower stage 332-side has been described. However, a reverse configuration is also possible.

That is, the substrate 230 retained on the lower stage 332-side may be released toward the substrate 210 retained on the upper stage 322-side.

In addition, the substrate holders 220 and 240 may be supplied with the negative pressure from the upper stage 322 and the lower stage 332, respectively, or may include a pump configured to supply the negative pressure.

For example, in any of the above-described embodiments, the substrate holder 240 or the like may have the main body 242 having a centrally convex shape on the support surface-side, in the cross section perpendicular to the support surface, and the plurality of support pins 245 or the like may have a constant height.

Further, in any of the above-described embodiments, the substrate holder 240 or the like may have the main body 242 having a linear shape on the support surface-side, in the cross section perpendicular to the support surface, and may also have the plurality of support pins 245 or the like whose heights become stepwise lower in the radial direction from the center of the central support portion 244 toward the circumferential edge of the circumferential support portion 246.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100: substrate bonding apparatus, 110: housing, 120, 130: substrate cassette, 140: conveying unit, 150: control unit, 210, 230: substrate, 211, 231: notch, 212, 232: bevel, 213: step portion, 214: BW end position, 215, 235: perimeter, 216: convex warping film, 237: tapered portion, 218, 238: void inflow groove, 219, 239: back surface step portion, 220, 240, 250, 260, 270, 280, 290: substrate holder, 241, 251, 281, 291: wall portion, 245, 265, 275, 285, 295: support pin, 247, 267: hole, 202: support, 261, 271: first wall portion, 262, 272: second wall portion, 263, 273: third wall portion, 203: radial separating portion, 201: stacked substrate, 300: bonding unit, 310: frame, 312: base plate, 316: ceiling plate, 322: upper stage, 326, 336: activation apparatus, 331: X-direction driving unit, 332: lower stage, 333: Y-direction driving unit, 338: lift driving unit, 400: holder stocker, 500: prealigner, 242: main body, 244, 254, 264, 274, 284, 294: central support portion, 246, 256, 266, 276, 286, 296: circumferential support portion, 248, 258, 268, 288, 298: inner region, 249, 259, 269, 289, 299: outer region

What is claimed is:

1. A substrate bonding apparatus comprising:
a substrate holder configured to retain a first substrate,
wherein the substrate holder includes:
a central support portion configured to support a central portion of the first substrate; and
an outside support portion arranged on an outside of the central support portion and configured to support an outside portion of the first substrate, the outside portion being located on an outside of the central portion, wherein a height of the outside support portion decreases from the central support portion side toward an outside of the substrate holder, wherein the outside support portion includes an inner region arranged adjacent to the central support portion and an outer region arranged on an outside of the inner region, the inner region is configured to support a center side part of the outside portion so as to be curved with a curvature greater than that of the central portion, the outer region is configured to support an edge side part of the outside portion so as to be curved with a curvature greater than that of the center side part, and the substrate bonding apparatus is configured to bond the first substrate and a second substrate to each other.

2. The substrate bonding apparatus according to claim 1, wherein the outside support portion includes an annular wall portion configured to support the edge side part of the outside portion.

3. The substrate bonding apparatus according to claim 1, wherein the outside support portion includes a curved surface which is configured to support the outside portion so as to be curved with a curvature greater than that of the central portion.

4. The substrate bonding apparatus according to claim 3, wherein the curved surface includes a plurality of ventilation holes and can adsorb the outside portion of the first substrate by a negative pressure.

5. The substrate bonding apparatus according to claim 1, wherein the outside support portion includes a plurality of support pins whose virtual support surface is a curved surface, and is configured to support the outside portion by the curved surface so as to be curved with a curvature greater than that of the central portion.

6. The substrate bonding apparatus according to claim 1, wherein the outside support portion includes a plurality of adsorbing regions, each of which can individually adsorb the outside portion of the first substrate.

7. The substrate bonding apparatus according to claim 6, wherein the plurality of adsorbing regions is located around holes in which lift-up pins for pushing the outside portion of the first substrate are inserted.

8. The substrate bonding apparatus according to claim 1, further comprising a driving unit configured to deform the outside support portion of the substrate holder so that the outside portion of the first substrate is curved with a curvature greater than that of the central portion.

9. The substrate bonding apparatus according to claim 8, further comprising:

a detection unit configured to detect that a contact region between the first substrate and the second substrate has reached a predetermined position, wherein the driving unit is configured to deform the outside support portion, in response to the detection unit detecting that the contact region has reached the position.

10. The substrate bonding apparatus according to claim 8, comprising an acquisition unit configured to acquire information about at least one of the outside portion of the first substrate and an outside portion of the second substrate, wherein the driving unit is configured to set a different amount of deformation at the outside support portion of the substrate holder, according to the information acquired by the acquisition unit.

11. The substrate bonding apparatus according to claim 10, wherein the information includes at least one of a width of trimming formed at the outside portion, an orientation of curve of the outside portion that has occurred before being retained by the substrate holder, a magnitude of the curve, a position of a notch formed at the outside portion, a manufacturing process of the first and second substrates and a material of the first and second substrates.

12. The substrate bonding apparatus according to claim 1, comprising a plurality of the substrate holders, wherein at least one of a curvature of the outside portion that is curved by the outside support portion, a width of the outside portion and a position of the outside portion is different for each of the plurality of substrate holders.

13. A substrate bonding apparatus comprising:

a substrate holder configured to retain a first substrate, wherein the substrate holder includes:

a central support portion configured to support a central portion of the first substrate; and an outside support portion arranged on an outside of the central support portion and configured to support an outside portion of the substrate, the outside portion being located on an outside of the central portion, wherein a height of the outside support portion decreases from the central support portion side toward an outside of the substrate holder so that a change in height of a support surface of the outside support portion to a change in distance from a center of the central support portion is greater than a change in height of a support surface of the central support portion to the change in distance from the center, wherein the outside support portion includes an inner region arranged adjacent to the central support portion and an outer region arranged on an outside of the inner region, the inner region is configured to support a center side part of the outside portion so as to be curved with a curvature greater than that of the central portion, the outer region is configured to support an edge side part of the outside portion so as to be curved with a curvature greater than that of the center side part, and the substrate bonding apparatus is configured to bond the first substrate and a second substrate to each other.

14. The substrate bonding apparatus according to claim 13, comprising a plurality of the substrate holders, wherein at least one of a curvature of the outside portion that is curved by the outside support portion, a width of the outside portion and a position of the outside portion is different for each of the plurality of substrate holders.

15. A substrate bonding method using the substrate bonding apparatus according to claim 1, comprising:

deforming the outside portion of the first substrate so that a height of the outside portion decreases from the central portion side toward an outside of the first substrate, the center side part of the outside portion is curved with the curvature greater than that of the central portion, and the edge side part of the outside portion is curved with the curvature greater than that of the center side part.

16. A substrate bonding method using the substrate bonding apparatus according to claim 13, comprising:

deforming the outside portion of the first substrate so that a height of the outside portion decreases from the central portion side toward an outside of the first substrate, the center side part of the outside portion is curved with the curvature greater than that of the central portion, and the edge side part of the outside portion is curved with the curvature greater than that of the center side part.

* * * * *